United States Patent
Ueno et al.

(10) Patent No.: US 11,804,182 B2
(45) Date of Patent: Oct. 31, 2023

(54) DISPLAY DEVICE WITH PIXEL STRUCTURE CAPABLE OF EXTRACTING LIGHT FROM QUANTUM-DOT LIGHT-EMITTING LAYER AND ORGANIC LIGHT-EMITTING LAYER OF PIXEL STRUCTURE

(71) Applicant: SHARP KABUSHIKI KAISHA, Sakai (JP)

(72) Inventors: Masafumi Ueno, Sakai (JP); Naoki Shiobara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/794,600

(22) PCT Filed: Jan. 27, 2020

(86) PCT No.: PCT/JP2020/002821
§ 371 (c)(1),
(2) Date: Jul. 21, 2022

(87) PCT Pub. No.: WO2021/152672
PCT Pub. Date: Aug. 5, 2021

(65) Prior Publication Data
US 2023/0063949 A1    Mar. 2, 2023

(51) Int. Cl.
*G09G 3/3258* (2016.01)
*H01L 31/06* (2012.01)

(52) U.S. Cl.
CPC .......... *G09G 3/3258* (2013.01); *H01L 31/06* (2013.01); *G09G 2300/0426* (2013.01); *G09G 2300/0452* (2013.01); *G09G 2320/0271* (2013.01)

(58) Field of Classification Search
CPC ......... G09G 3/3258; G09G 2300/0452; G09G 2320/0271; H01L 31/06
See application file for complete search history.

(56) References Cited

U.S. PATENT DOCUMENTS

| | | | |
|---|---|---|---|
| 2007/0075627 A1 | 4/2007 | Kimura et al. | |
| 2009/0128458 A1 | 5/2009 | Kim et al. | |
| 2009/0261715 A1 | 10/2009 | Sung et al. | |
| 2014/0183464 A1* | 7/2014 | Baek | H01L 27/3213 257/89 |
| 2017/0221969 A1* | 8/2017 | Steckel | H01L 51/5044 |

FOREIGN PATENT DOCUMENTS

| | | | |
|---|---|---|---|
| CN | 107527942 A | 12/2017 | |
| CN | 110797376 A * | 2/2020 | ............ C23C 16/40 |
| JP | 2007-122033 A | 5/2007 | |
| JP | 2015-216059 A | 12/2015 | |

* cited by examiner

*Primary Examiner* — Kwang-Su Yang
(74) *Attorney, Agent, or Firm* — ScienBiziP, P.C.

(57) ABSTRACT

A first pixel electrode electrically connected to a first transistor, a second pixel electrode electrically connected to a second transistor, a first light-emitting layer formed over the first pixel electrode and overlapping the first pixel electrode, a second light-emitting layer formed over the second pixel electrode and overlapping the second pixel electrode are provided, the first light-emitting layer includes a quantum-dot light-emitting that emits light of a first color, and the second light-emitting layer includes an organic light-emitting layer that emits light of a second color different from the first color.

17 Claims, 24 Drawing Sheets

(a)

(b)

DISPLAY DEVICE WITH PIXEL STRUCTURE CAPABLE OF EXTRACTING LIGHT FROM QUANTUM-DOT LIGHT-EMITTING LAYER AND ORGANIC LIGHT-EMITTING LAYER OF PIXEL STRUCTURE

TECHNICAL FIELD

The disclosure relates to a display device.

BACKGROUND ART

Patent Literature 1 discloses a light-emitting element including an organic light-emitting layer and a quantum-dot light-emitting layer stacked between an anode and a cathode.

CITATION LIST

Patent Literature

Patent Literature 1: Japanese Unexamined Patent Application Publication No. 2015-216059

SUMMARY

Technical Problem

In the configuration in Patent Literature 1, the organic light-emitting layer is formed on the quantum-dot light-emitting layer; accordingly, light that exits upward from the quantum-dot light-emitting layer passes through the organic light-emitting layer, and light that exits downward from the organic light-emitting layer passes through the quantum-dot layer, thus causing a problem, i.e., degradation in the efficiency of light extraction from each of the quantum-dot light-emitting layer and the organic light-emitting layer.

Solution to Problem

A display device according to one aspect of the disclosure includes a first pixel electrode electrically connected to a first transistor, a second pixel electrode electrically connected to a second transistor, a first light-emitting layer formed over the first pixel electrode and overlapping the first pixel electrode, and a second light-emitting layer formed over the second pixel electrode and overlapping the second pixel electrode; herein, the first light-emitting layer includes a quantum-dot light-emitting layer that emits light of a first color, and the second light-emitting layer includes an organic light-emitting layer that emits light of a second color different from the first color.

The aspect of the disclosure can achieve a pixel structure with enhanced efficiency of light extraction from each of a quantum-dot light-emitting layer and an organic light-emitting layer.

BRIEF DESCRIPTION OF DRAWINGS

Portion (a) of FIG. 1 is a schematic plan view of a configuration of a display device in embodiments, and (b) of FIG. 1 is a sectional view of the configuration of the display device.

Figure 3:
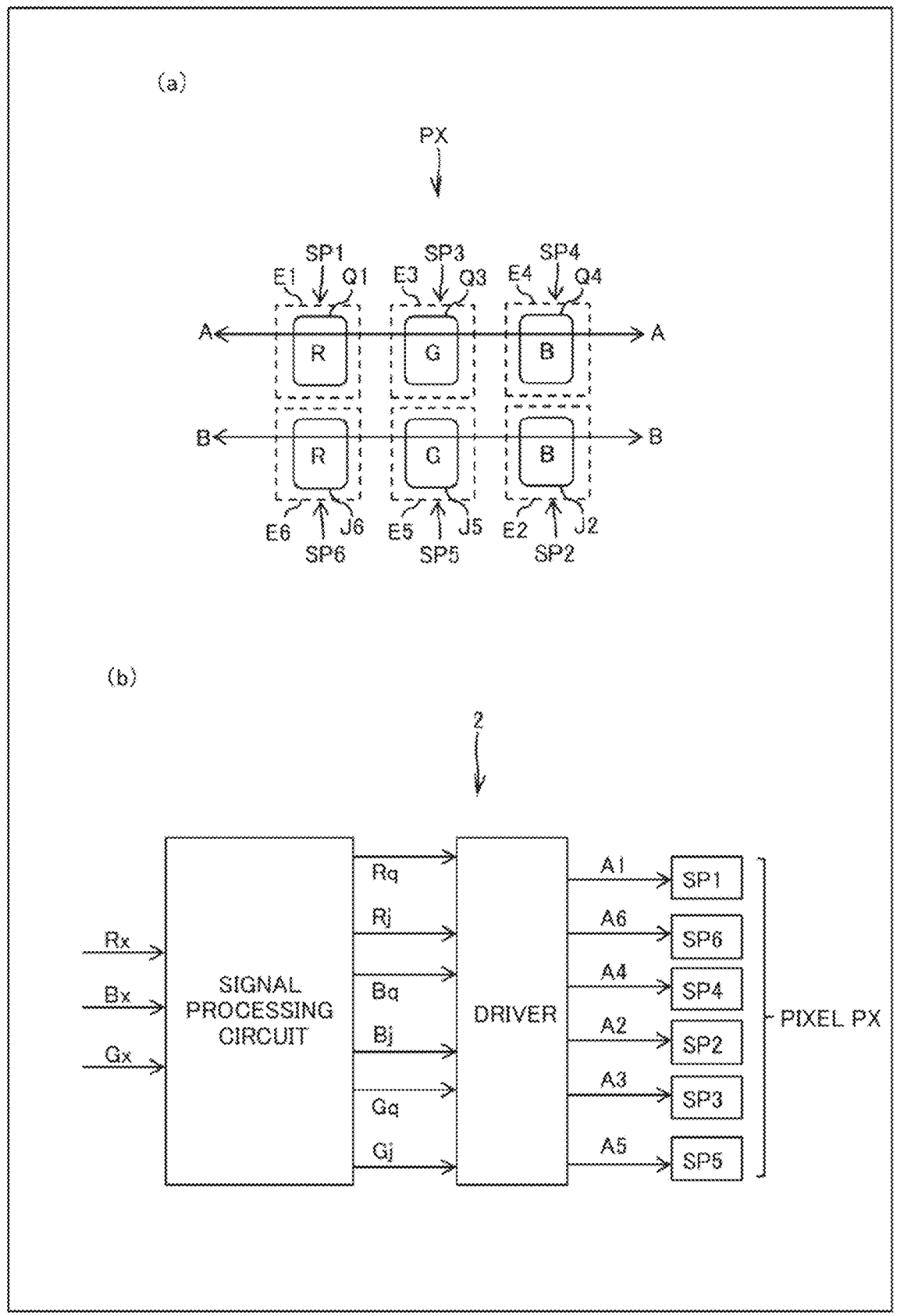

Portion (a) of FIG. 3 is a plan view of a configuration of a pixel in a first embodiment, and (b) of FIG. 3 is a block diagram illustrating a configuration in the first embodiment.

Figure 4:
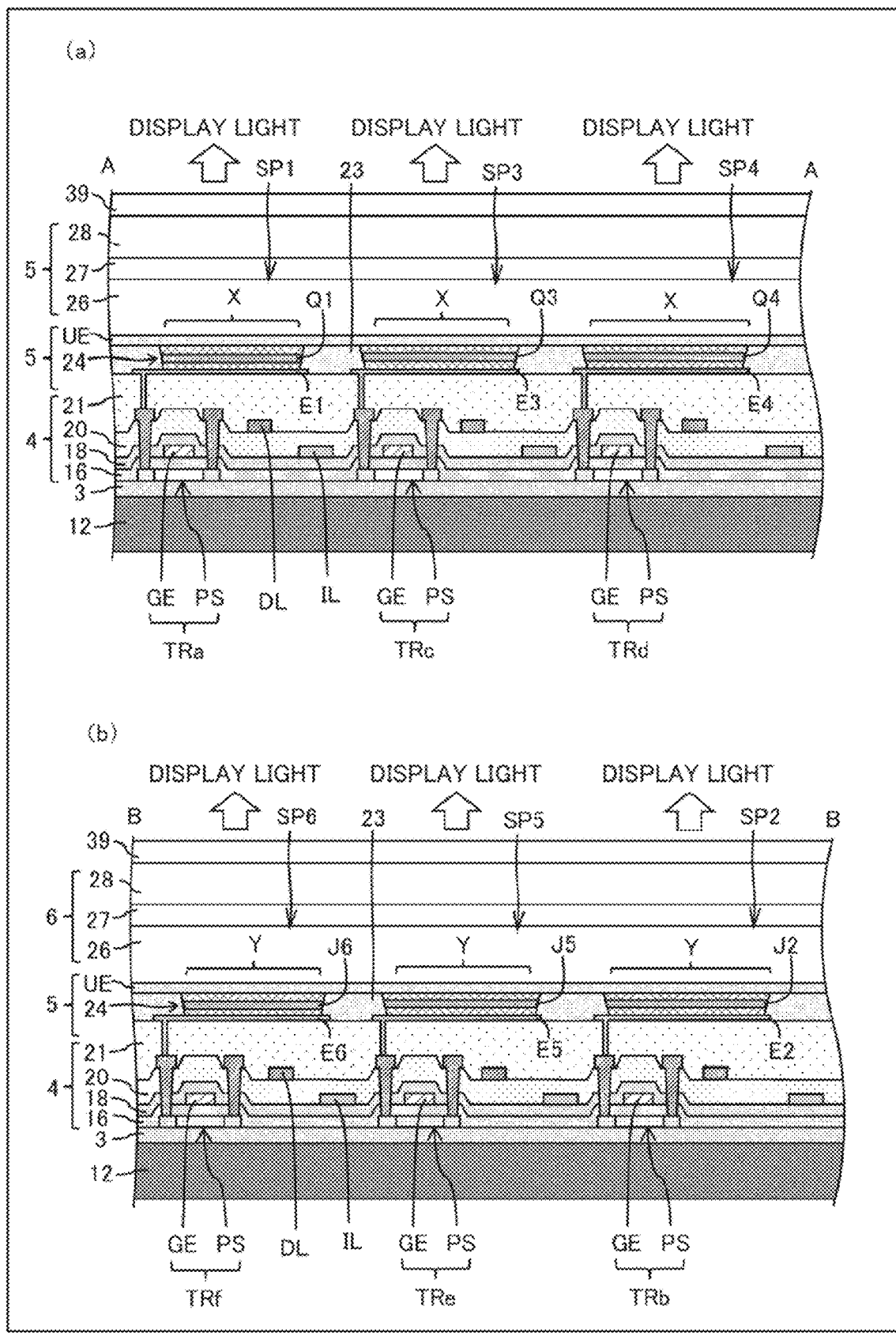

Portion (a) of FIG. 4 is a sectional view taken along line A-A in (a) of FIG. 3, and (b) of FIG. 4 is a sectional view taken along line B-B in (a) of FIG. 3.

Figure 5:
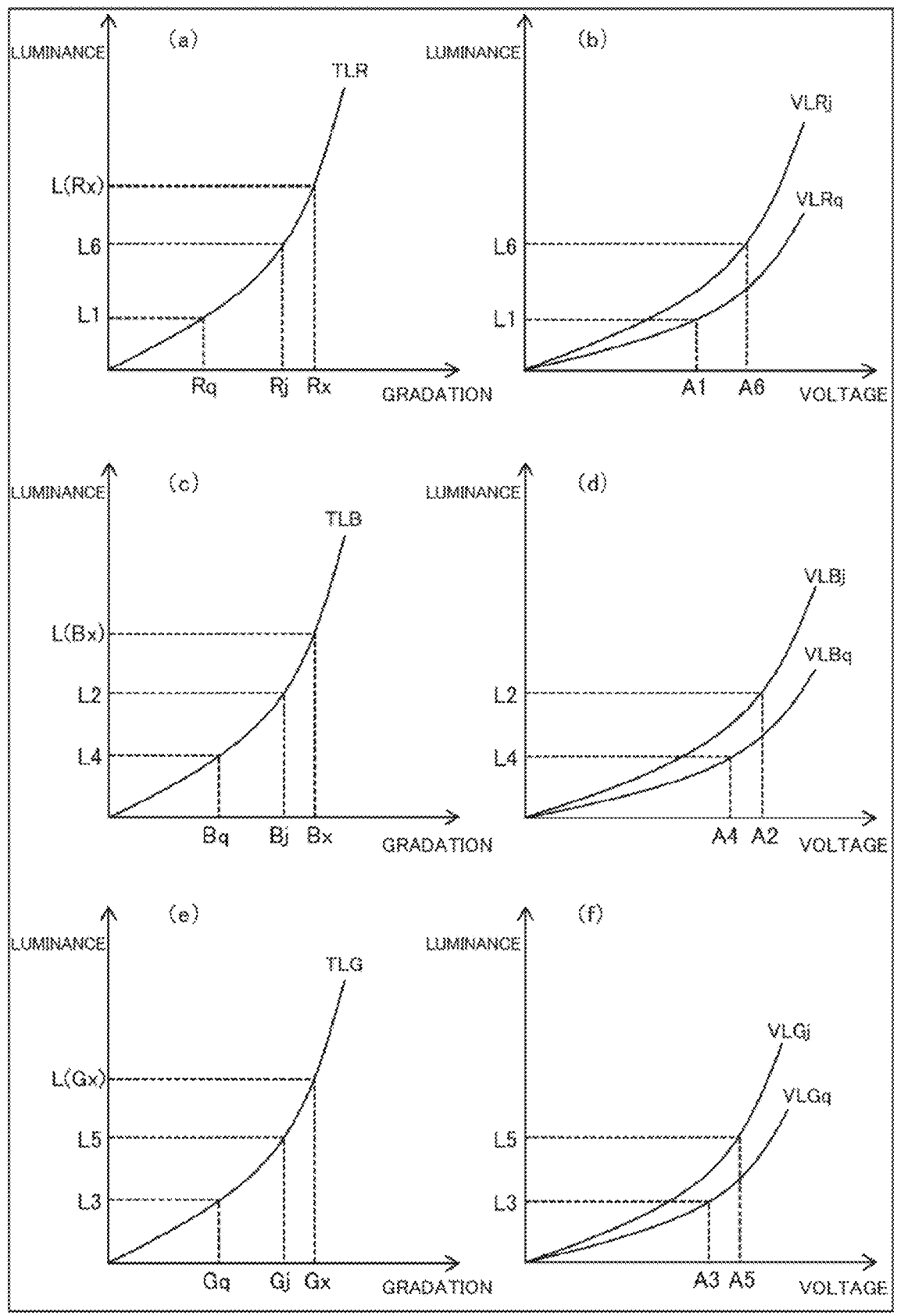

Portion (a) of FIG. 5 illustrates a gradation-luminance characteristic relating to red, (b) of FIG. 5 illustrates a voltage-luminance curve relating to red, (c) of FIG. 5 illustrates a gradation-luminance characteristic relating to blue, (d) of FIG. 5 illustrates a voltage-luminance curve relating to blue, (e) of FIG. 5 illustrates a gradation-luminance characteristic relating to green, and (f) of FIG. 5 illustrates a voltage-luminance curve relating to green.

Figure 6:
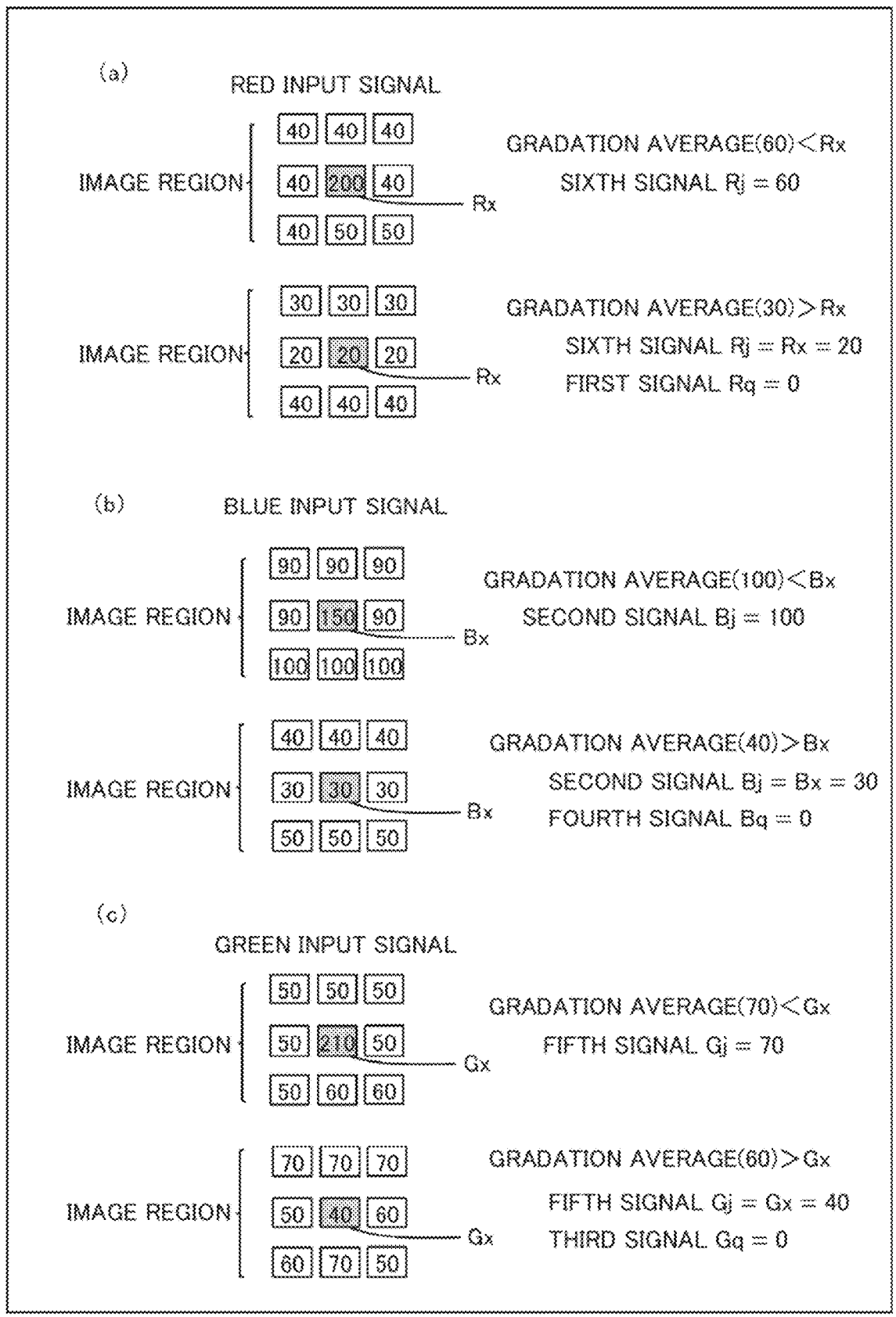

Portion (a) of FIG. 6 is a schematic diagram illustrating a method of processing a red input signal in a first control method, (b) of FIG. 6 is a schematic diagram illustrating a method of processing a blue input signal in the first control method, and (c) of FIG. 6 is a schematic diagram illustrating a method of processing a green input signal in the first control method.

Figure 7:
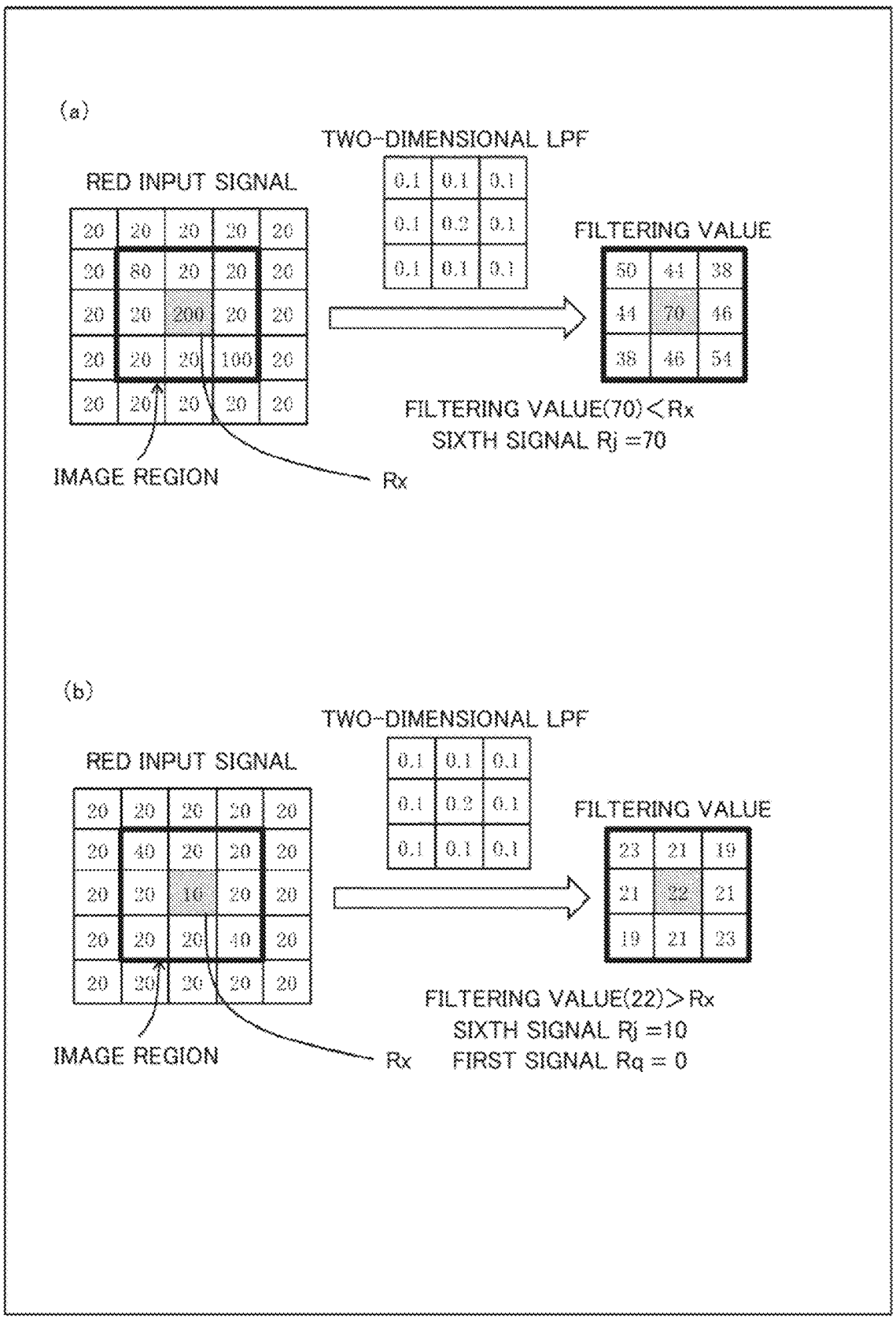

FIG. 7 is a schematic diagram illustrating another method of processing a red input signal in the first control method.

Figure 8:
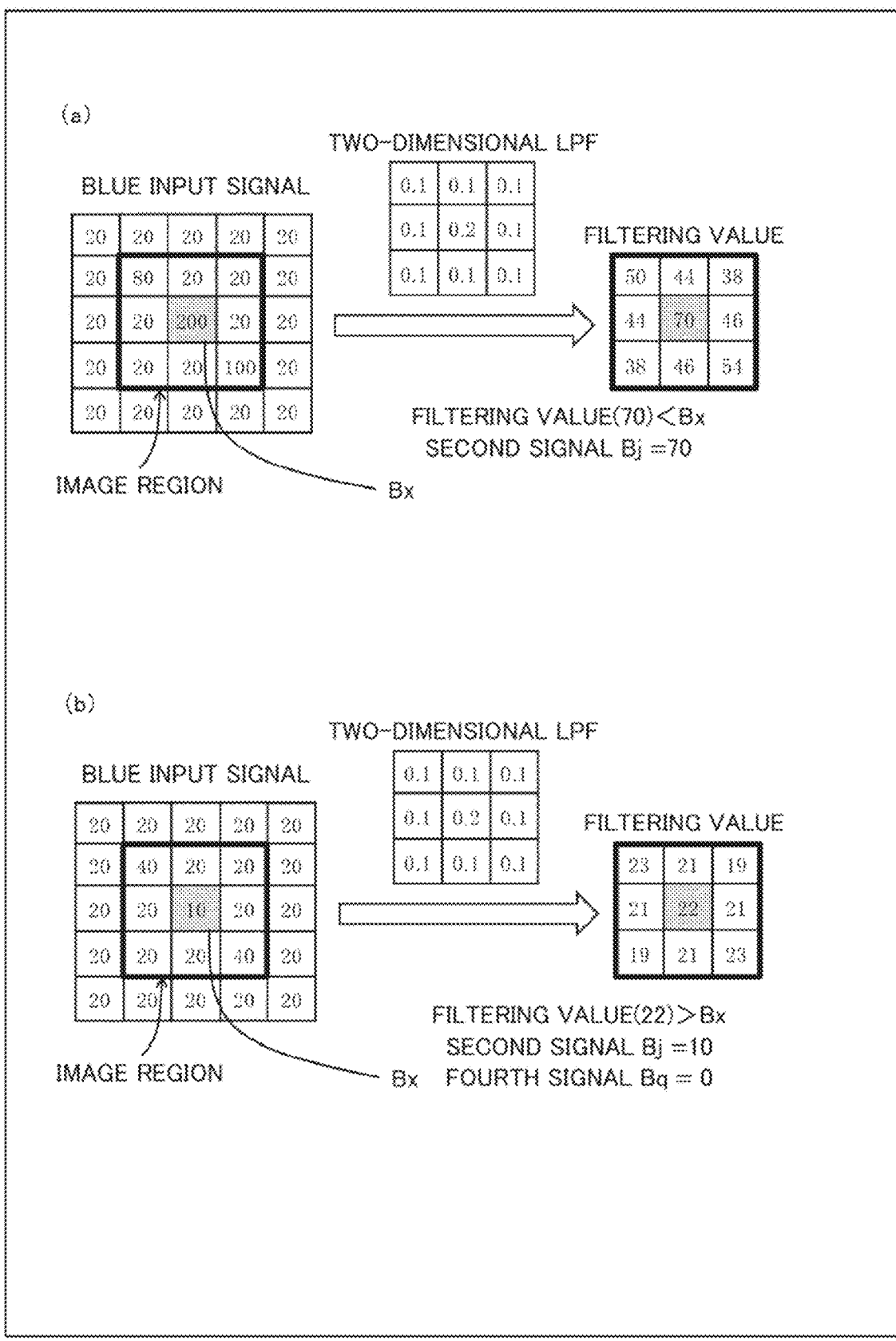

FIG. 8 is a schematic diagram illustrating another method of processing a blue input signal in the first control method.

Figure 9:
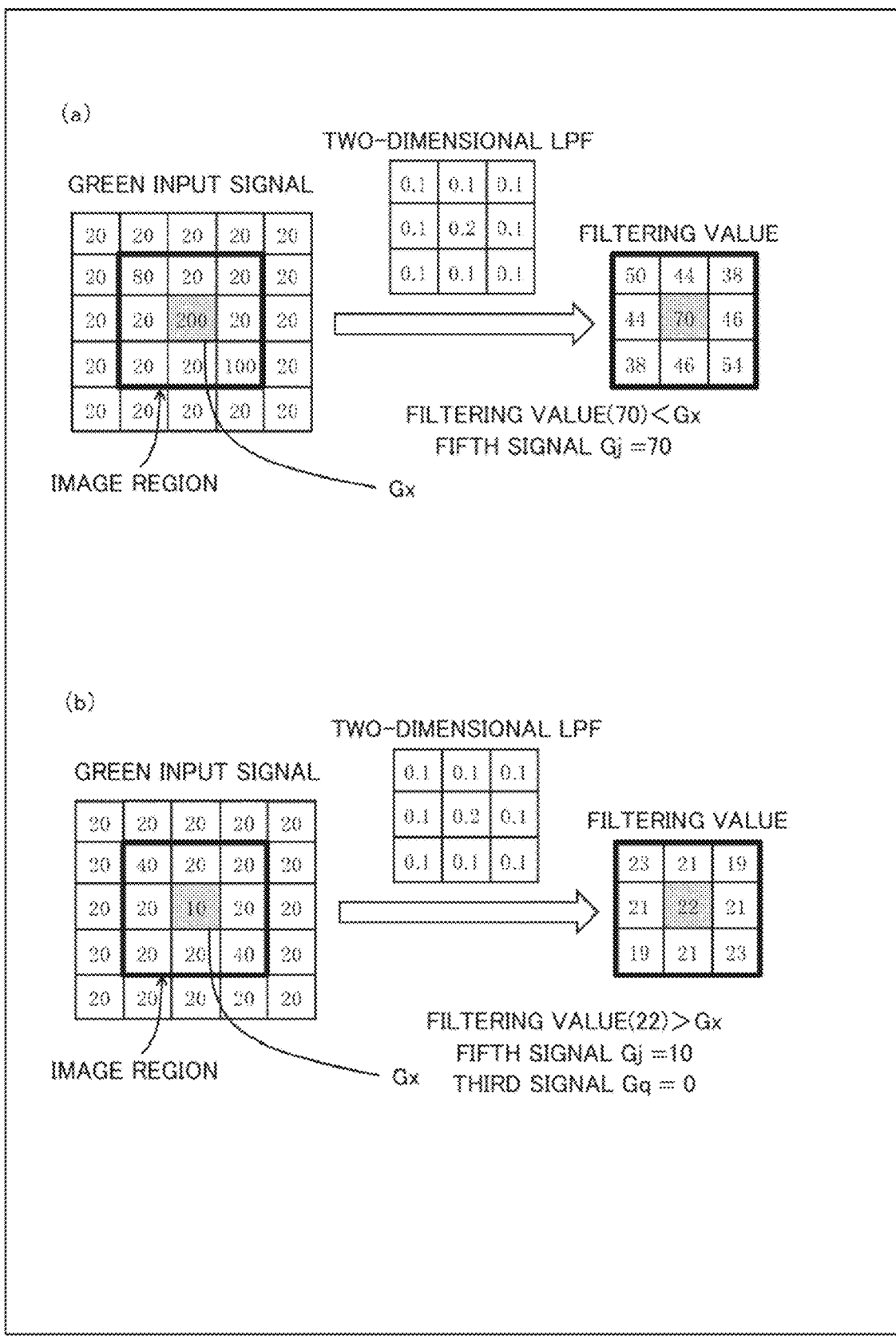

FIG. 9 is a schematic diagram illustrating another method of processing a green input signal in the first control method.

Figure 10:
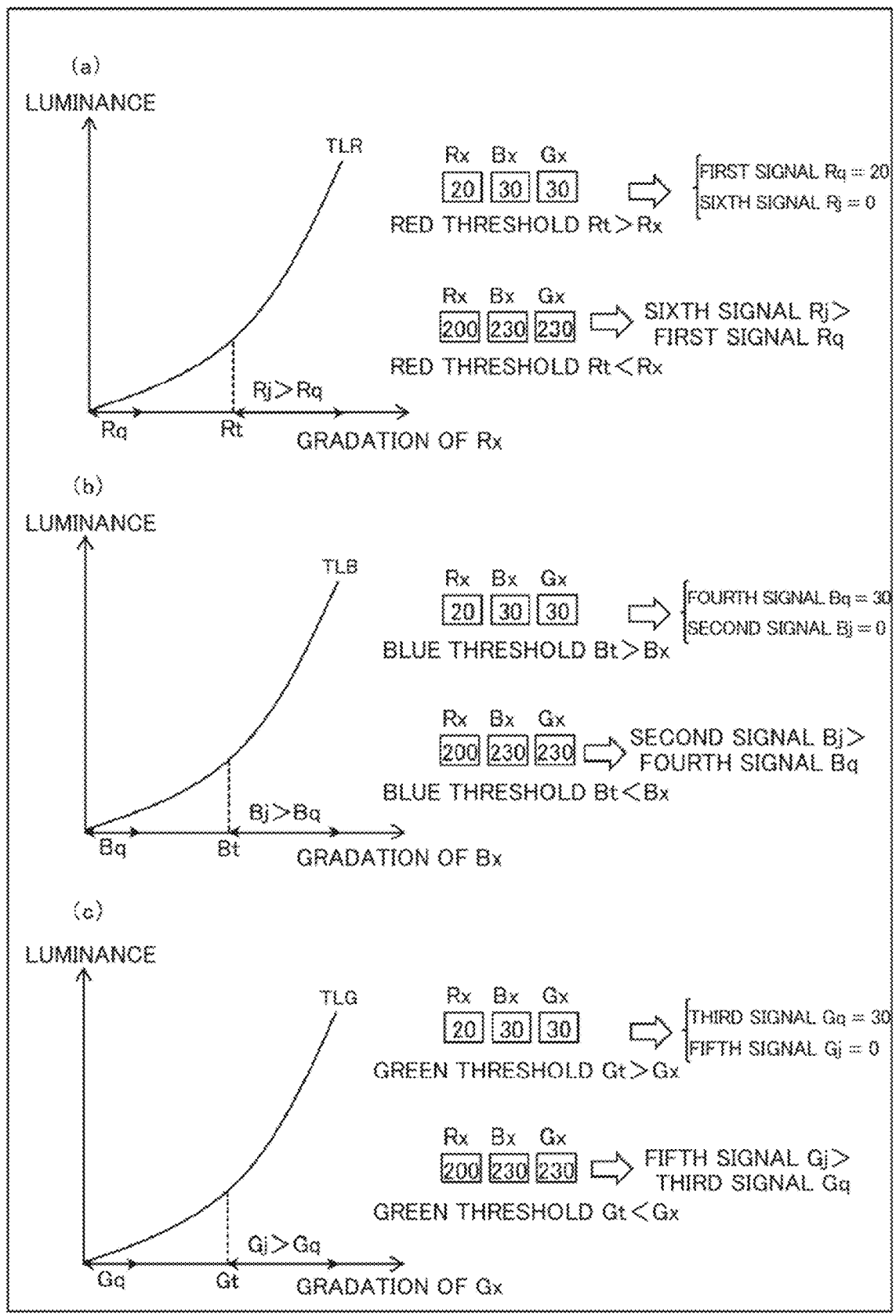

Portion (a) of FIG. 10 is a schematic diagram illustrating a method of processing a red input signal in a second control method, (b) of FIG. 10 is a schematic diagram illustrating a method of processing a blue input signal in the second control method, and (c) of FIG. 10 is a schematic diagram illustrating a method of processing a green input signal in the second control method.

Figure 11:
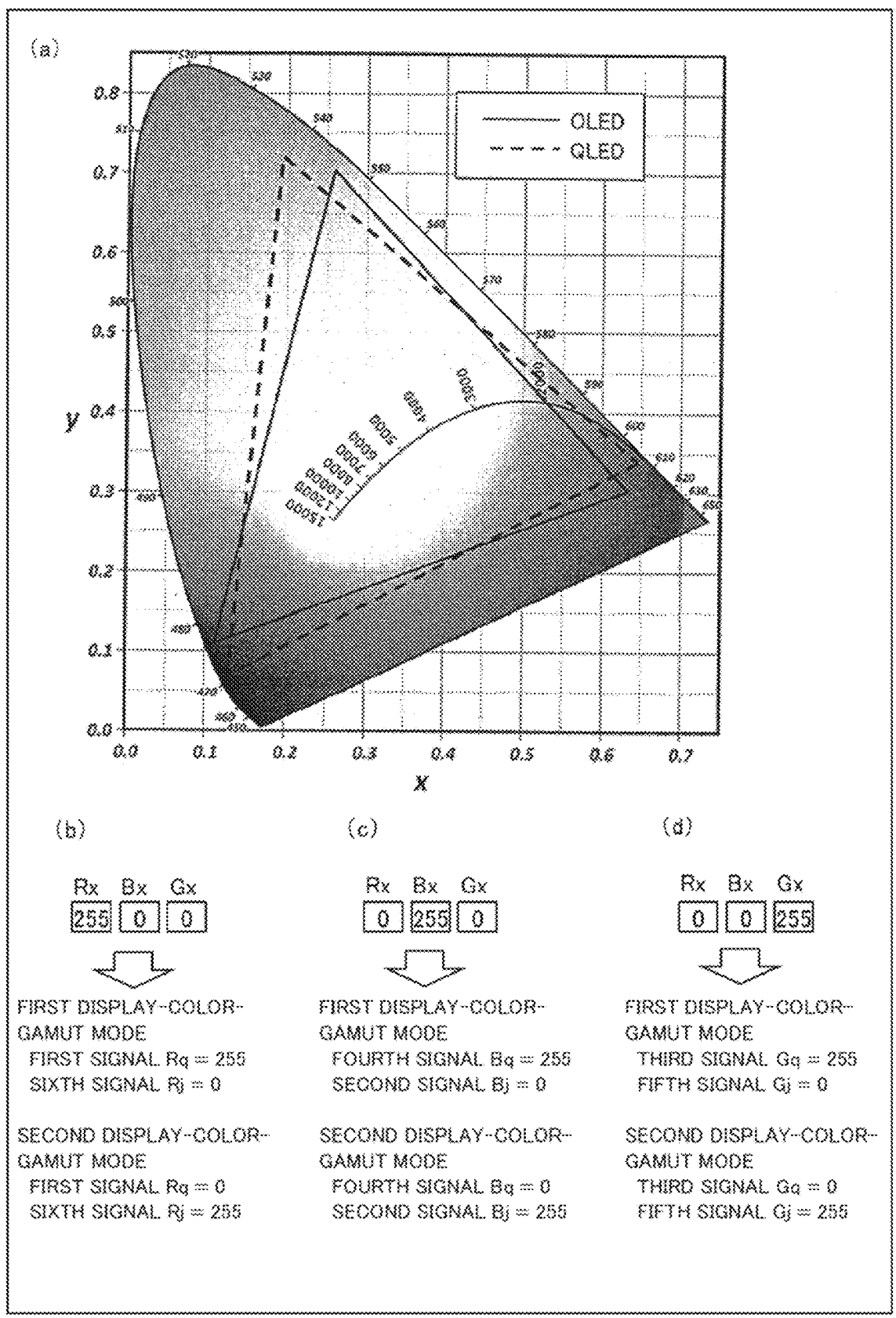

Portion (a) of FIG. 11 is a graph showing a color gamut of a light-emitting element (OLED) having an organic light-emitting layer, and a color gamut of a light-emitting element (QLED) having a quantum-dot light-emitting layer, (b) of FIG. 11 is a schematic diagram illustrating a method of processing a red input signal in a third control method, (c) of FIG. 11 is a schematic diagram illustrating a method of processing a blue input signal in the third control method, and (d) of FIG. 11 is a schematic diagram illustrating a method of processing a green input signal in the third control method.

Figure 12:
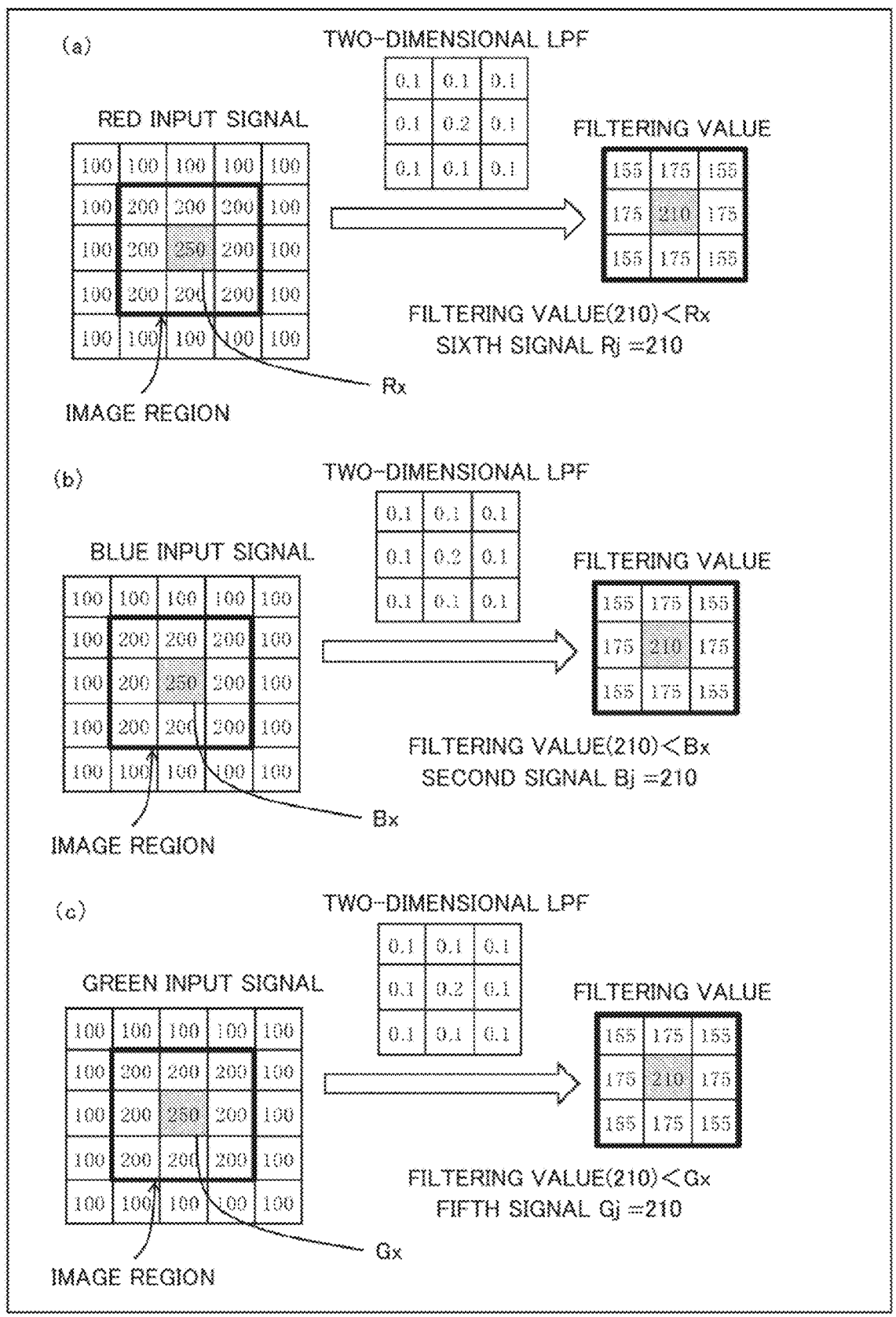

Portion (a) of FIG. 12 is a schematic diagram illustrating a method of processing a red input signal in a fourth control method, (b) of FIG. 12 is a schematic diagram illustrating a method of processing a blue input signal in the fourth control method, and (c) of FIG. 12 is a schematic diagram illustrating a method of processing a green input signal in the fourth control method.

Figure 13:
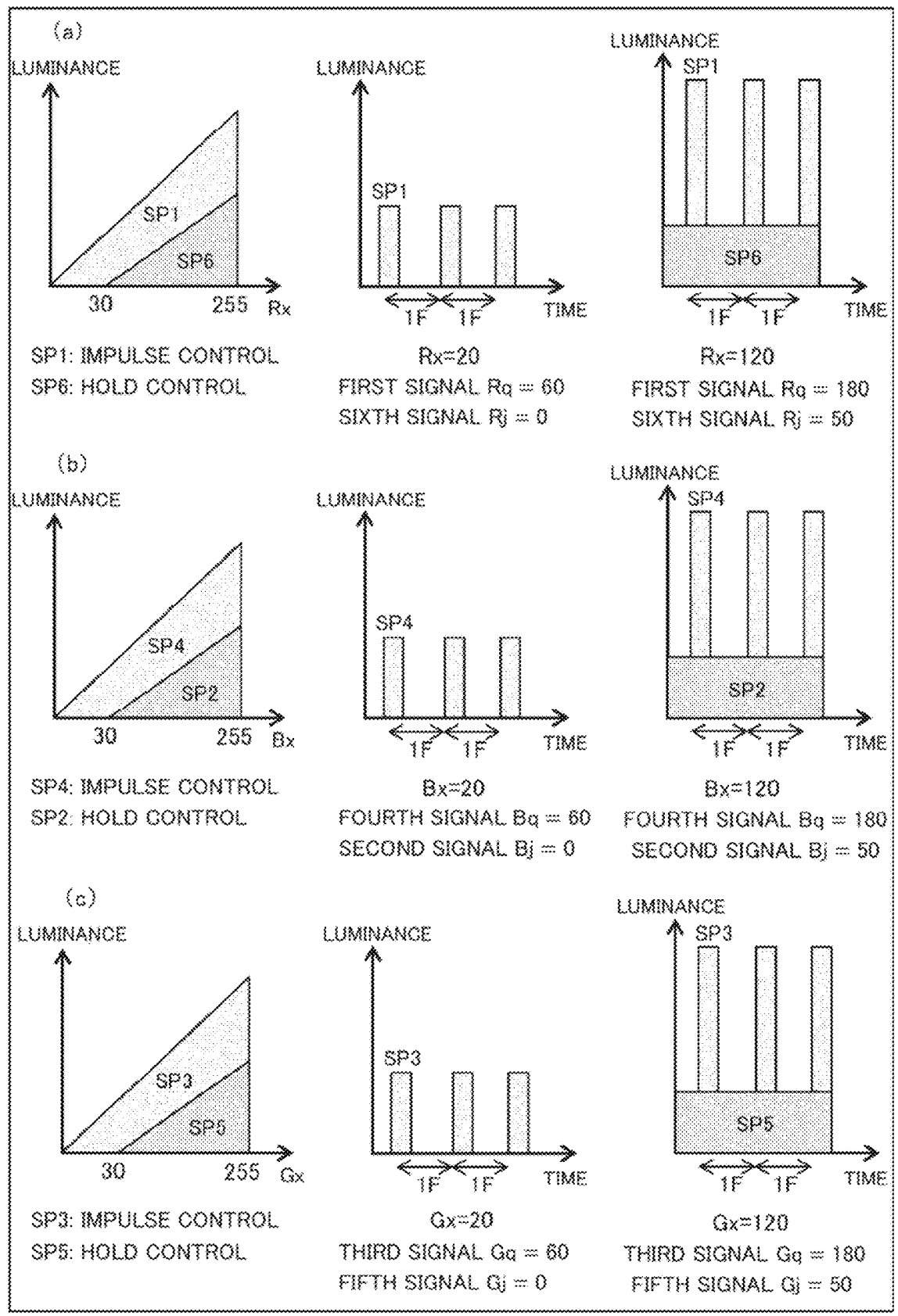

Portion (a) of FIG. 13 is a schematic diagram illustrating a method of processing a red input signal in a fifth control method, (b) of FIG. 13 is a schematic diagram illustrating a method of processing a blue input signal in the fifth control method, and (c) of FIG. 13 is a schematic diagram illustrating a method of processing a green input signal in the fifth control method.

Figure 14:
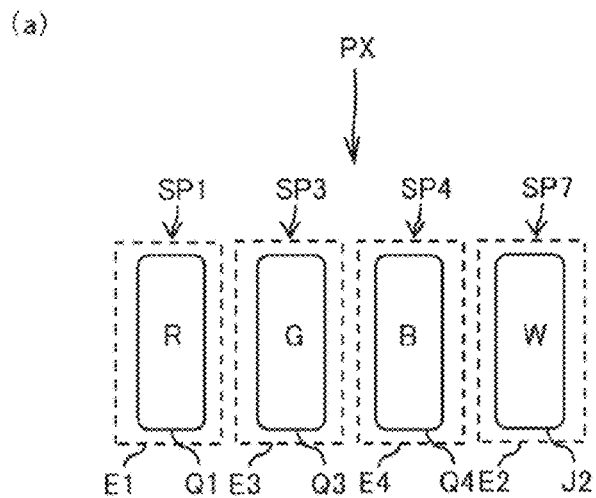
Figure 14:
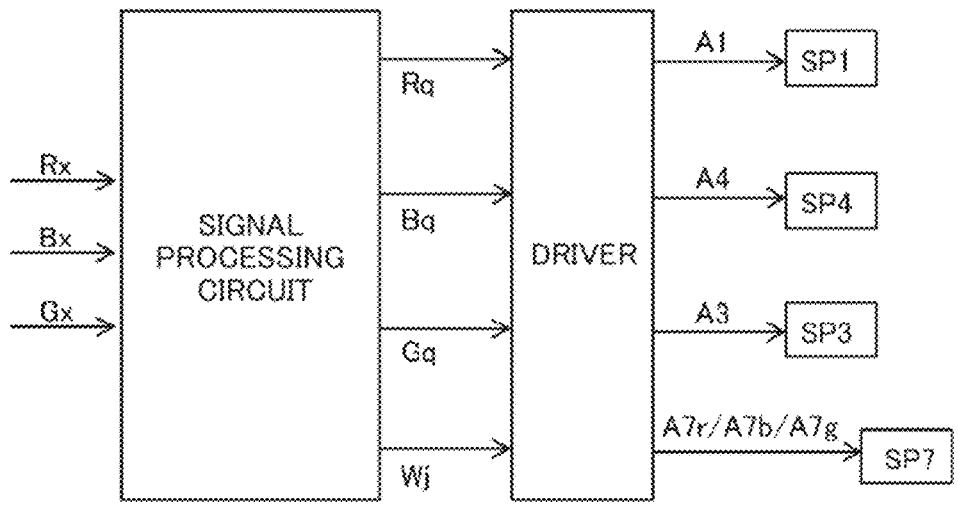

Portion (a) of FIG. 14 is a plan view of a configuration of a pixel in a second embodiment, and (b) of FIG. 14 is a block diagram of a configuration of a display device in the second embodiment.

Figure 15:
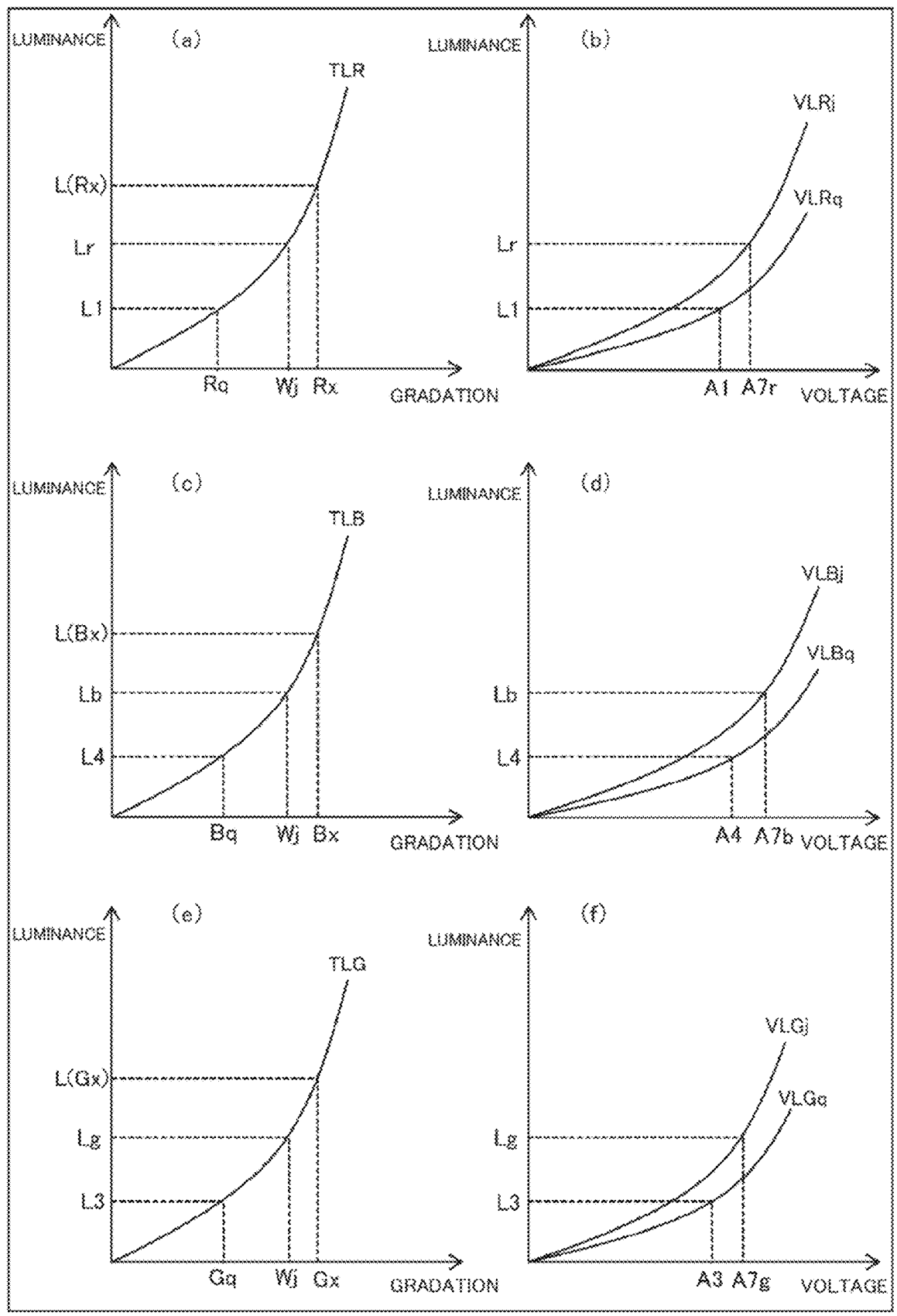

Portion (a) of FIG. 15 illustrates a gradation-luminance characteristic relating to red, (b) of FIG. 15 illustrates a voltage-luminance curve relating to red, (c) of FIG. 15 illustrates a gradation-luminance characteristic relating to blue, (d) of FIG. 15 illustrates a voltage-luminance curve relating to blue, (e) of FIG. 15 illustrates a gradation-luminance characteristic relating to green, and (f) of FIG. 15 illustrates a voltage-luminance curve relating to green.

Figure 16:
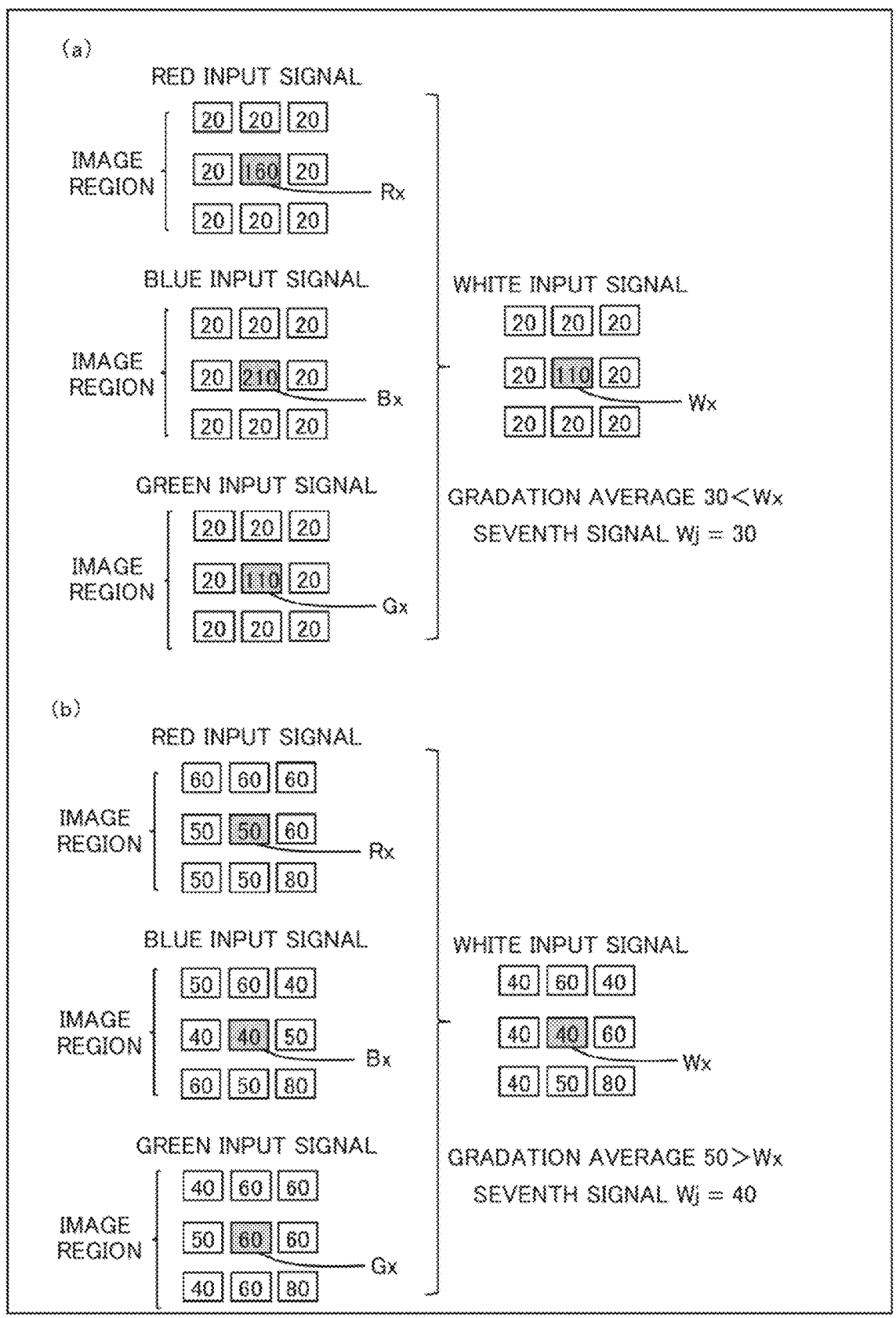

FIG. 16 is a schematic diagram illustrating a method of processing red, blue and green input signals in a sixth control method.

Figure 17:
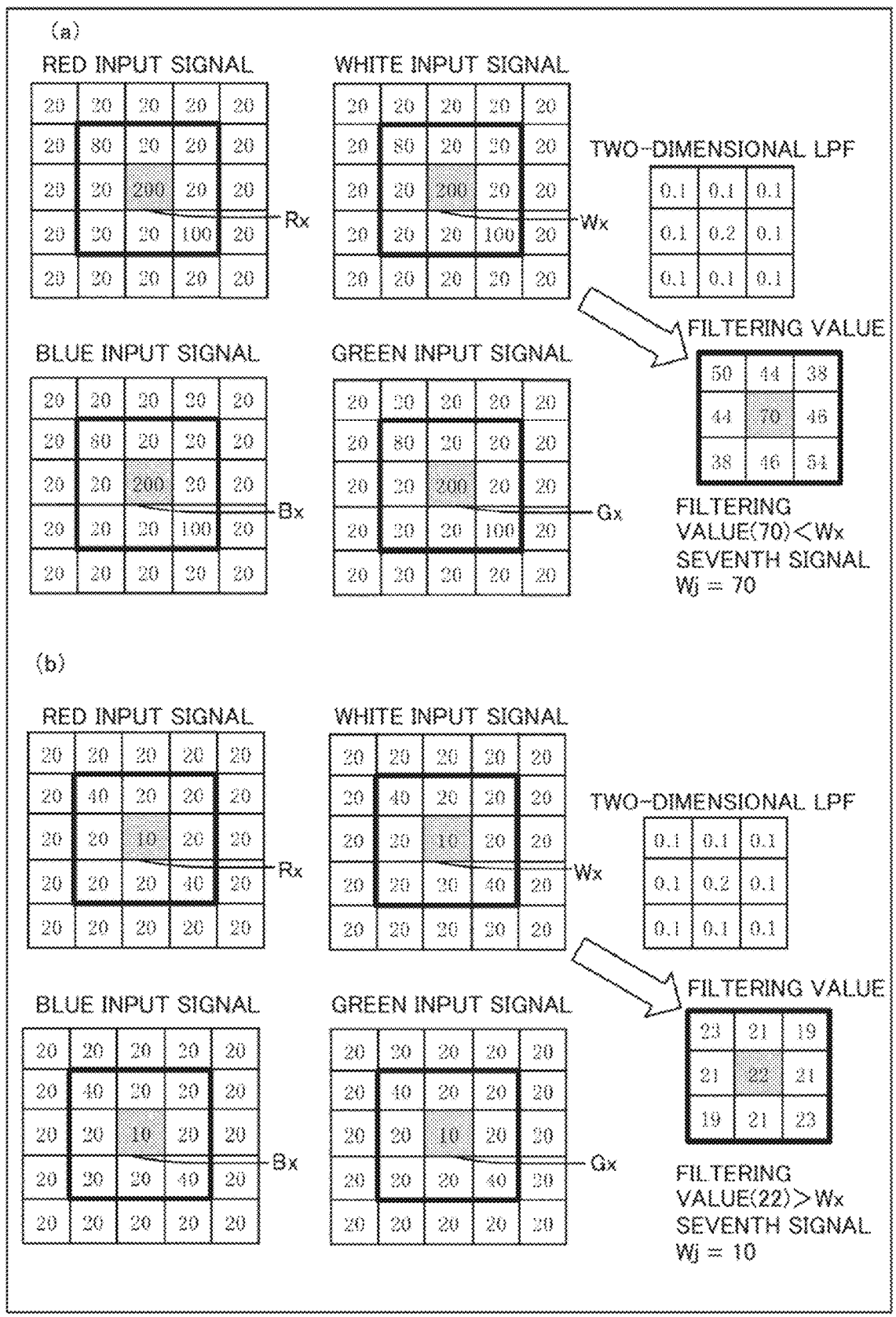

FIG. 17 is a schematic diagram illustrating another method of processing red, blue and green input signals in the sixth control method.

Figure 18:
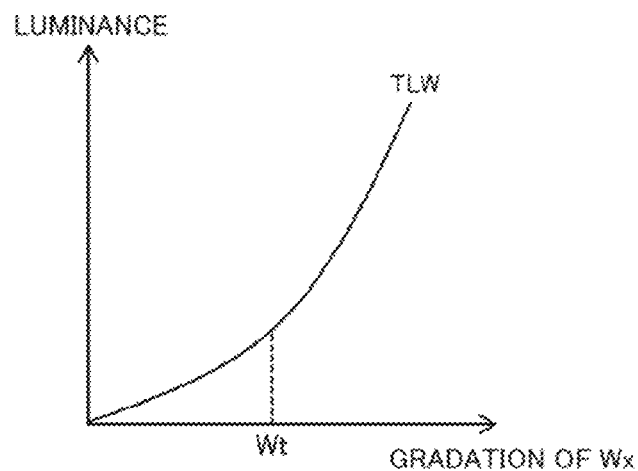

Portion (a) of FIG. 18 illustrates a gradation-luminance characteristic relating to white, and (b) of FIG. 18 is a schematic diagram illustrating a method of processing red, blue and green input signals in a seventh control method.

Figure 19:
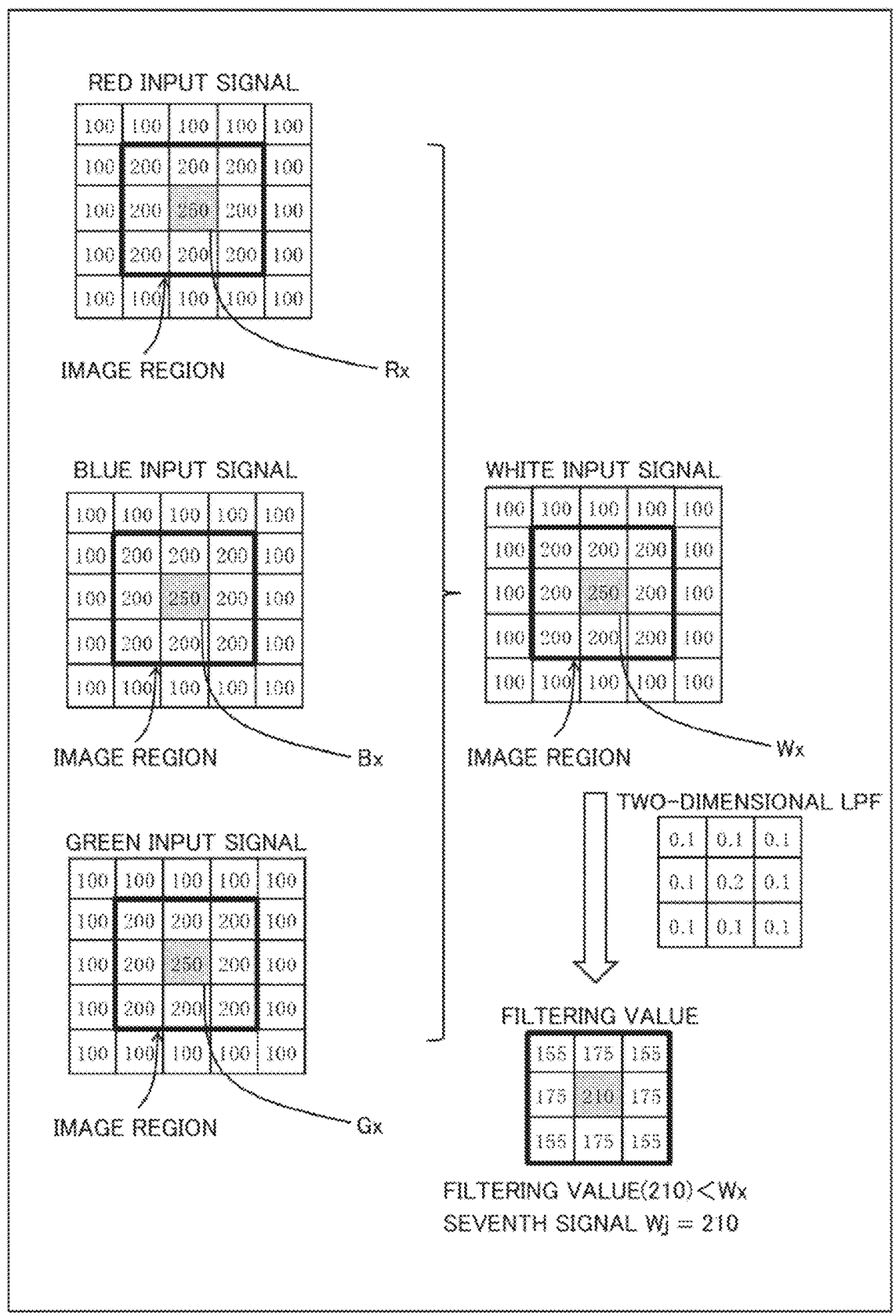

FIG. 19 is a schematic diagram illustrating a method of processing red, blue and green input signals in an eighth control method.

Figure 20:
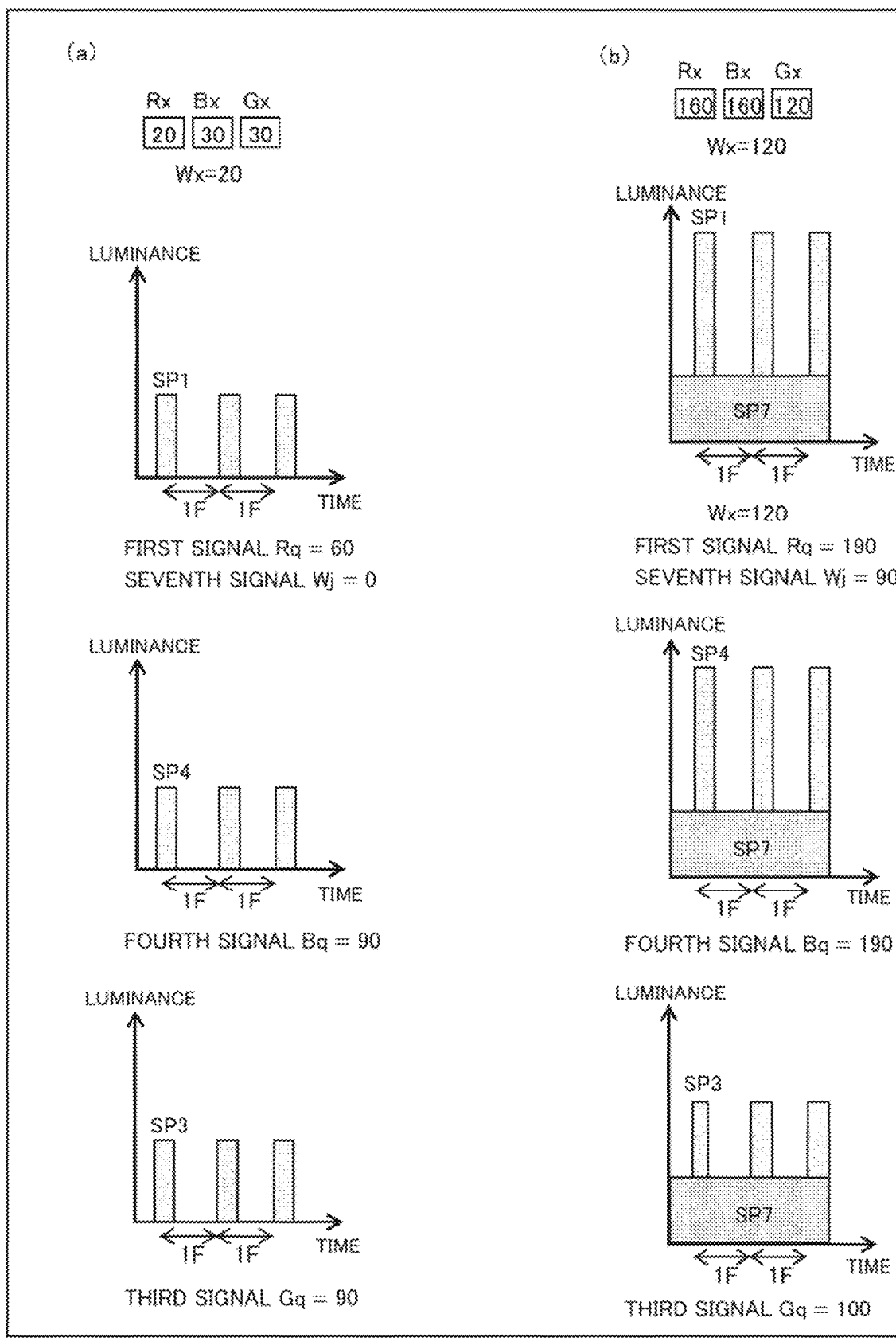

FIG. 20 is a schematic diagram illustrating a method of processing red, blue and green input signals in a ninth control method.

Figure 21:
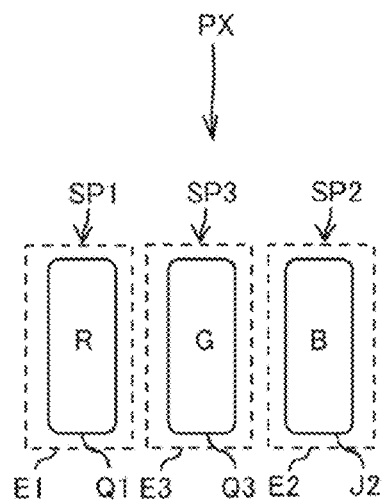
Figure 21:
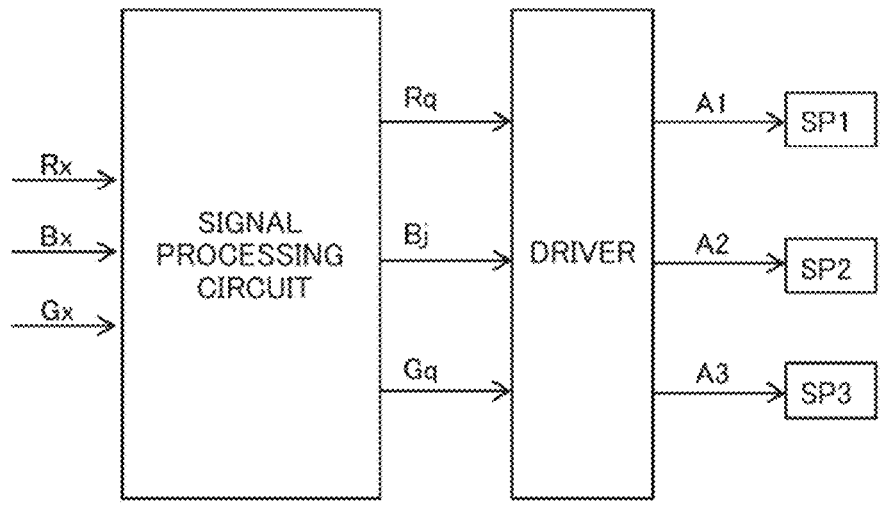

Portion (a) of FIG. 21 is a plan view of a configuration of a pixel in a third embodiment, and (b) of FIG. 21 is a block diagram of a configuration of a display device in the third embodiment.

Figure 22:
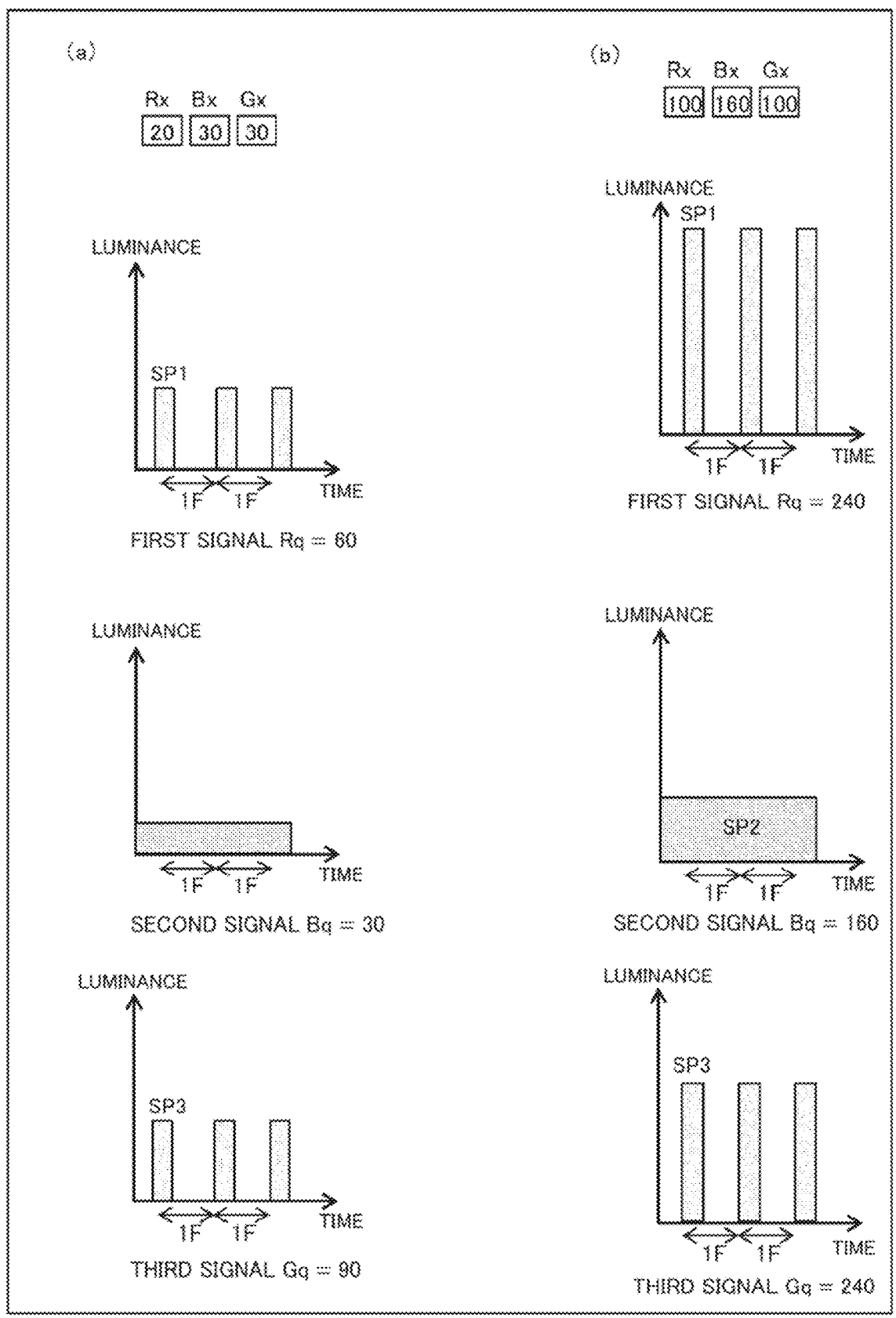

FIG. 22 is a schematic diagram illustrating a method of processing red, blue and green input signals in a tenth control method.

Figure 23:
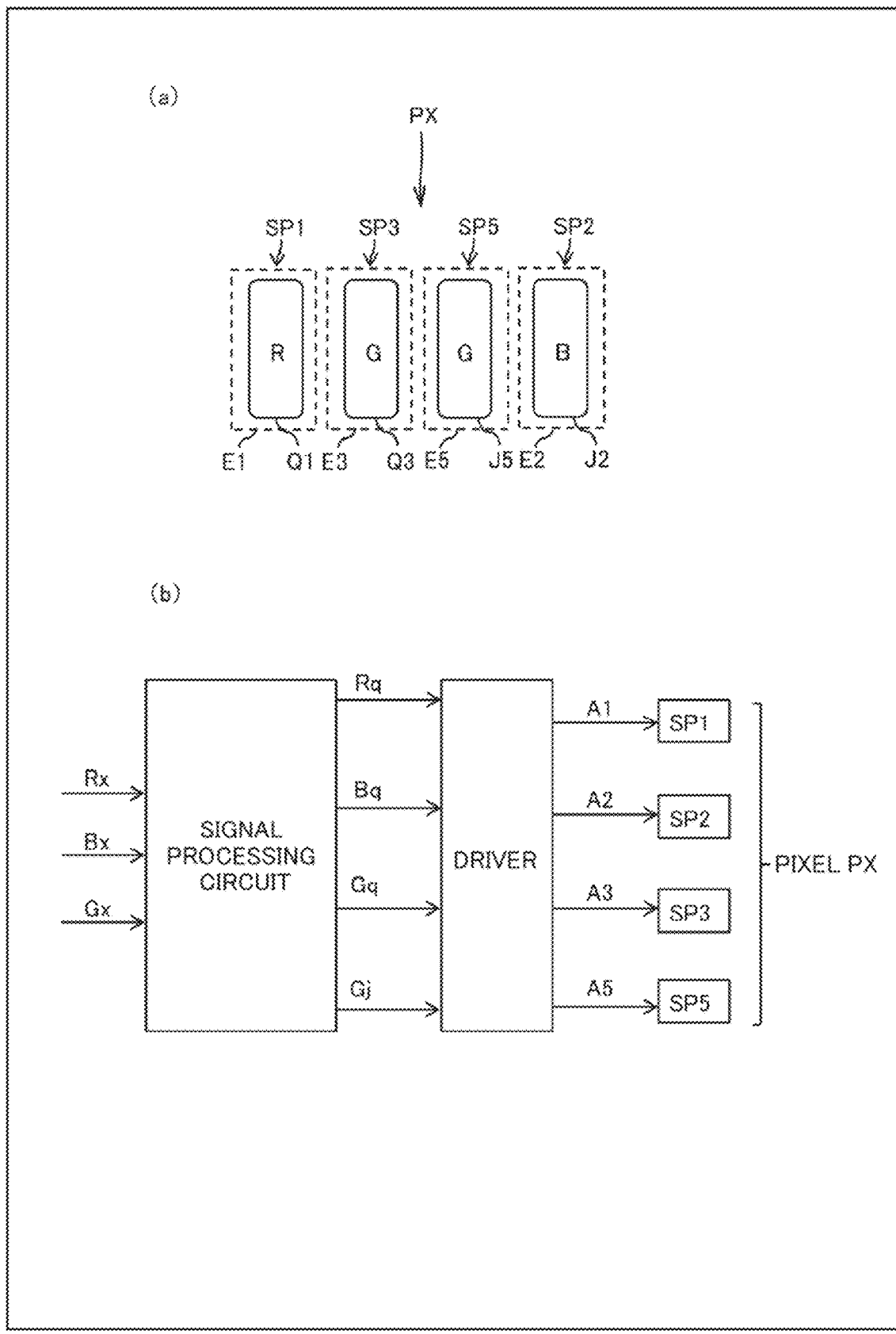

Portion (a) of FIG. 23 is a plan view of a configuration of a pixel in a fourth embodiment, and (b) of FIG. 23 is a block diagram of a configuration of a display device in the fourth embodiment.

Figure 24:
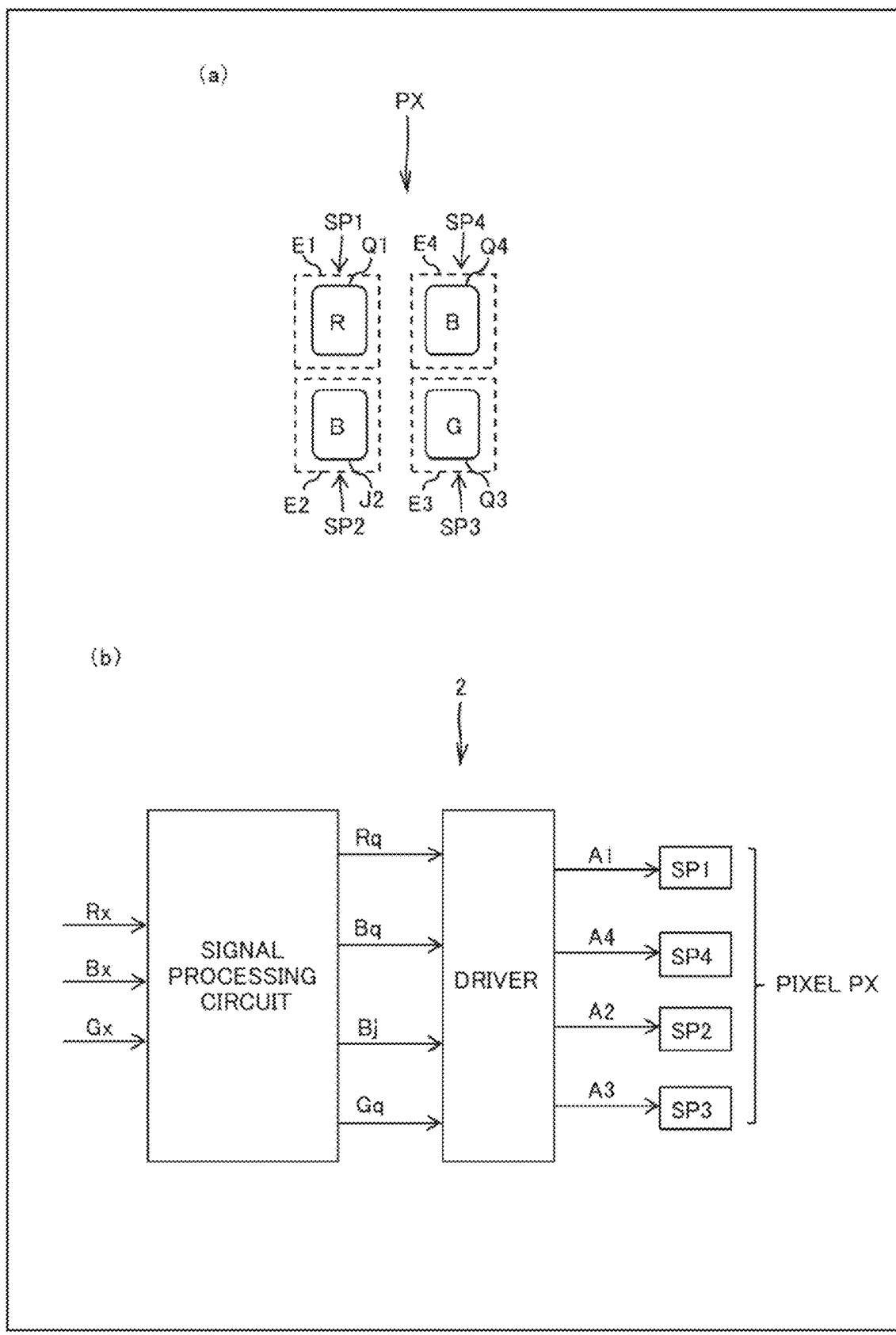

Portion (a) of FIG. 24 is a plan view of a configuration of a pixel in a fifth embodiment, and (b) of FIG. 24 is a block diagram of a configuration of a display device in the fifth embodiment.

DESCRIPTION OF EMBODIMENTS

Figure 1:
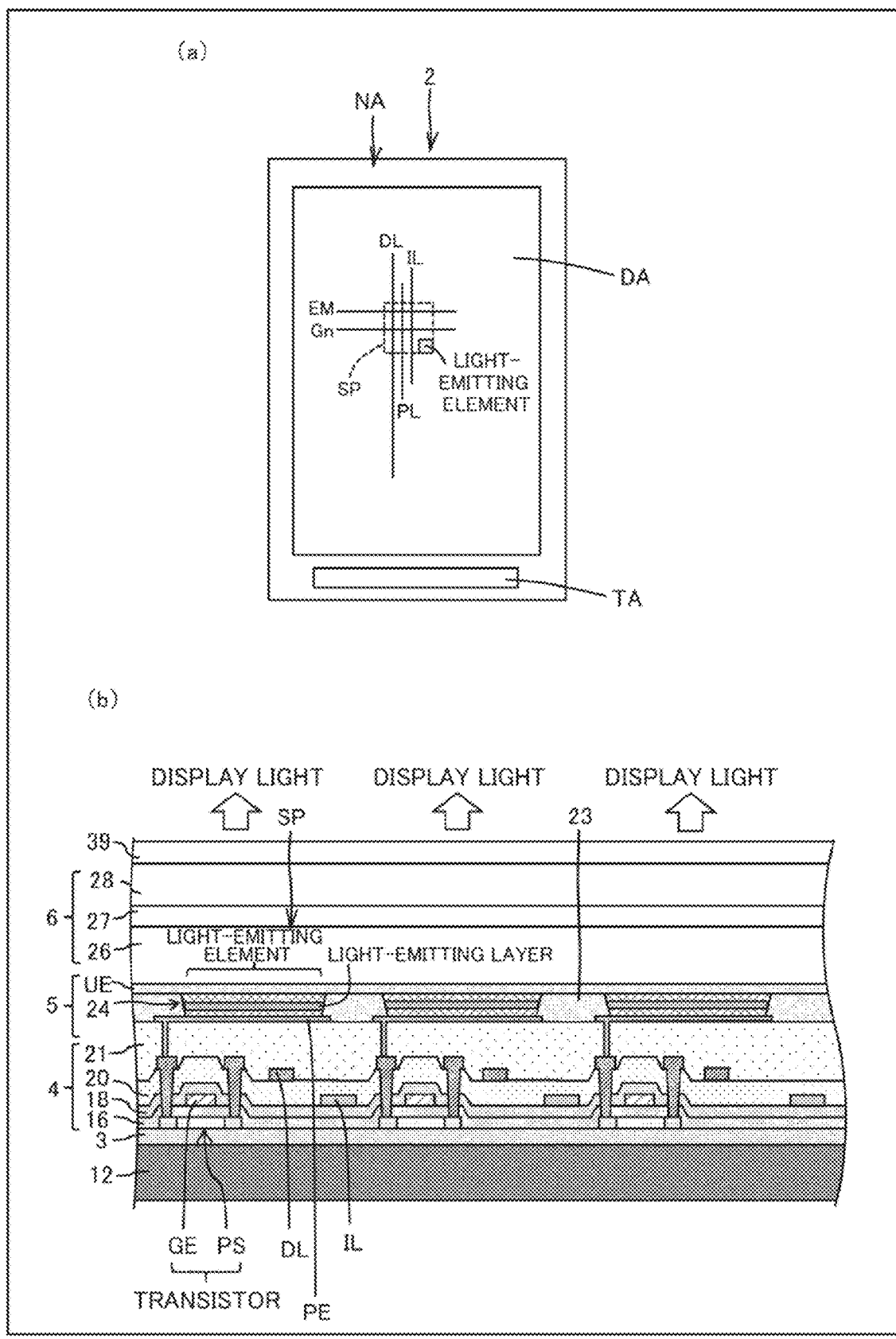

Portion (a) of FIG. 1 is a schematic plan view of a configuration of a display device in the embodiments, and (b) of FIG. 1 is a sectional view of the configuration of the display device.

As illustrated in FIG. 1, a display device 2 has a barrier layer 3, a thin-film transistor layer 4, a top-emission (upward emission of light) light-emitting element layer 5, and a sealing layer 6 formed in this order on a substrate 12 and has a plurality of subpixels SP formed in a display region DA and each including a self-emission light-emitting element. A terminal section TA is provided in a frame region NA surrounding the display region DA.

The substrate 12 is a glass substrate or a flexible substrate mainly made of resin, such as polyimide; for instance, the substrate 12 can be also composed of two polyimide films and an inorganic film interposed therebetween. The barrier layer (undercoat layer) 3 is an inorganic insulating film that prevents intrusion of foreign substances, such as water and oxygen, and can be made of, for instance, silicon nitride, silicon oxide, or other materials.

As illustrated in (b) of FIG. 1, the thin-film transistor layer 4 includes a semiconductor layer PS over the barrier layer 3, a gate insulating film 16 over the semiconductor layer PS, a first metal layer (including a gate electrode GE) over the gate insulating film 16, a first interlayer insulating film 18 over the first metal layer, a second metal layer (including initialization wires IL) over the first interlayer insulating film 18, a second interlayer insulating film 20 over the second metal layer, a third metal layer (including data signal lines DL) over the second interlayer insulating film 20, and a flattening film 21 over the third metal layer.

The semiconductor layer PS is, for instance, low-temperature polysilicon (LTPS), and a transistor TR is composed of the gate electrode GE and the semiconductor layer PS.

The first metal layer, the second metal layer, and the third metal layer are composed of, for instance, a metal monolayer or multilayer film containing at least one of aluminum, tungsten, molybdenum, tantalum, chromium, titanium, and copper.

The gate insulating film 16, the first interlayer insulating film 18, and the second interlayer insulating film 20 can be composed of a silicon oxide (SiOx) film or a silicon nitride (SiNx) film formed through, for instance, CVD or can be composed of a laminate of these films. The flattening film 21 can be made of an organic material that can be applied, such as polyimide or acrylic resin.

The light-emitting element layer 5 includes a pixel electrode PE over the flattening film 21, an insulating edge cover film 23 covering the edge of the pixel electrode PE, an electroluminescence (EL) layer 24 over the edge cover film 23, and an upper electrode UE over the EL layer 24. The edge cover film 23 is formed by applying an organic material, such as polyimide or acrylic resin, followed by patterning through photolithography.

As illustrated in FIG. 1, a plurality of light-emitting elements that emit different colors, for instance, are formed in the light-emitting element layer 5; each light-emitting element includes the pixel electrode PE in the form of an island, the EL layer 24 (including a light-emitting layer), and the upper electrode UE. The upper electrode UE is a flat, common electrode shared among the plurality of light-emitting elements.

The EL layer 24 is composed by, for instance, stacking a hole injection layer, a hole transport layer, a light-emitting layer, an electron transport layer, and an electron injection layer sequentially from the bottom. The light-emitting layer is provided in the form of an island in the openings of the edge cover film 23 (for each subpixel) through evaporation, an ink-jet method, or photolithography. The other layers are formed in the form of an island or in a flat manner (common layer). Further, a configuration where one or more of the hole injection layer, the hole transport layer, the electron transport layer, and the electron injection layer are not formed can be established.

The pixel electrode PE (e.g., an anode) is a light-reflective electrode composed of, for instance, a stack of indium tin oxide (ITO) and either silver (Ag) or Ag-containing alloy. The upper electrode UE (e.g., a cathode) is composed of a thin film of metal, such as magnesium silver alloy, and has light transparency.

The light-emitting element layer 5 includes a quantum-dot light-emitting layer containing quantum dots that emit light of fundamental colors (e.g., red, blue, and green), and an organic light-emitting layer containing organic compounds that emit light of fundamental colors (e.g., red, blue, and green). The quantum dots are, for instance, inorganic semiconductors having a particle diameter of several nanometers to several-ten nanometers and emits light in response to a current or other things.

With regard to the organic light-emitting layer, a drive current between the pixel electrode PE and the upper electrode UE causes holes and electrons to rejoin within the organic light-emitting layer, thus generating excitons, and the excitons emit light during the process of transition to a ground state. With regard to the quantum-dot light-emitting layer, a drive current between the pixel electrode PE and the upper electrode UE causes holes and electrons to rejoin within the quantum-dot light-emitting layer, thus generating excitons, and the excitons emit light during the process of transition from a conduction band level of the quantum dots to a valence band level of the quantum dots.

In (b) of FIG. 1, the sealing layer 6, covering the light-emitting element layer 5, is a layer that prevents foreign substances, such as water and oxygen, from intrusion into the light-emitting element layer 5 and can be composed of, for instance, two inorganic sealing films 26 and 28 and an organic film 27 formed therebetween.

Figure 2:
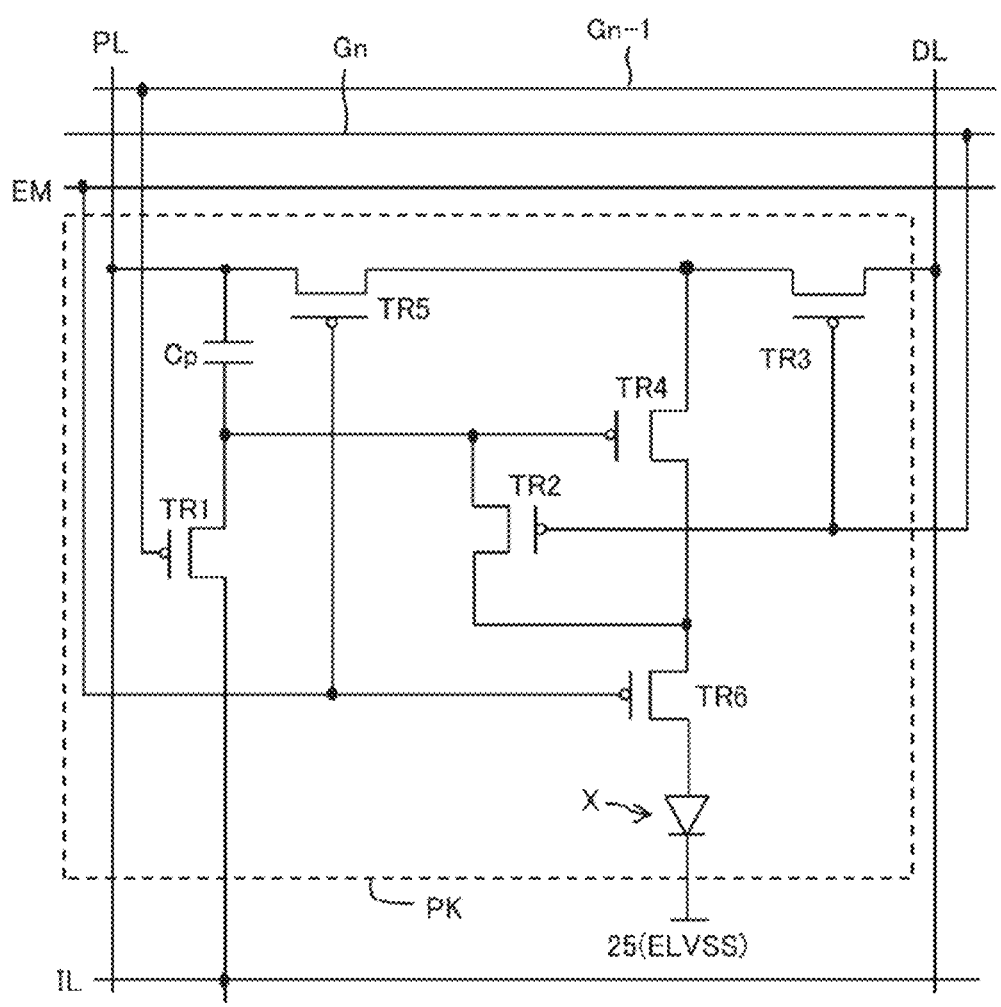
FIG. 2 is a circuit diagram illustrating an example pixel circuit.

FIG. 2 is a circuit diagram illustrating an example pixel circuit. The display region DA in FIG. 1 is provided, for each pixel, with a light-emitting element and a pixel circuit PK that controls the element, and these pixel circuits and wires connected thereto are formed in the thin-film transistor layer 4.

The pixel circuit PK in FIG. 2 includes the following: a capacitive element Cp; a first initialization transistor TR1 with its gate terminal connected to a scan signal line Gn−1, which is in an anterior stage (n−1 stage); a threshold control transistor TR2 with its gate terminal connected to a scan signal line Gn (first scan signal line), which is in a target stage (n stage); a write control transistor TR3 with its gate terminal connected to the scan signal line Gn, which is in the target stage (n stage); a drive transistor TR4 that controls a current flowing through a light-emitting element X; a power supply transistor TR5 with its gate terminal connected to a light-emission control line EM (n stage); and a light-emission control transistor TR6 with its gate terminal connected to the light-emission control line EM (n stage).

The gate terminal of the drive transistor TR4 is connected to a high-voltage power-source line PL via the capacitive element Cp and is connected to the initialization power-source line IL via the first initialization transistor TR1. The source terminal of the drive transistor TR4 is connected to the data signal line DL via the write control transistor TR3 and is connected to the high-voltage power-source line PL via the power supply transistor TR5. The drain terminal of the drive transistor TR4 is connected to the anode of the light-emitting element X via the light-emission control transistor TR6 and is connected to the gate terminal of the drive transistor TR4 via the threshold control transistor TR2.

First Embodiment

Portion (a) of FIG. 3 is a plan view of a configuration of a pixel in a first embodiment, and (b) of FIG. 3 is a block diagram illustrating a configuration in the first embodiment. Portion (a) of FIG. 4 is a sectional view taken along line A-A in (a) of FIG. 3, and (b) of FIG. 4 is a sectional view taken along line B-B in (a) of FIG. 3.

As illustrated in FIGS. 3 and 4, the pixel in the first embodiment includes a first pixel electrode E1 electrically connected to a first transistor TRa, a second pixel electrode E2 electrically connected to a second transistor TRb, a third pixel electrode E3 electrically connected to a third transistor TRc, a fourth pixel electrode E4 electrically connected to a fourth transistor TRd, a fifth pixel electrode E5 electrically connected to a fifth transistor TRe, a sixth pixel electrode E6 electrically connected to a sixth transistor TRf, a first light-emitting layer Q1 formed over the first pixel electrode E1 and overlapping the first pixel electrode E1, a second light-emitting layer J2 formed over the second pixel electrode E2 and overlapping the second pixel electrode E2, a third light-emitting layer Q3 formed over the third pixel electrode E3 and overlapping the third pixel electrode E3, a fourth light-emitting layer Q4 formed over the fourth pixel electrode E4 and overlapping the fourth pixel electrode E4, a fifth light-emitting layer J5 formed over the fifth pixel electrode E5 and overlapping the fifth pixel electrode E5, and a sixth light-emitting layer J6 formed over the sixth pixel electrode E6 and overlapping the sixth pixel electrode E6. The first pixel electrode E1 to the sixth pixel electrode E6 are formed in the same layer and are each formed in the form of an island. It is noted that "over" refers to that one layer is formed in a process step posterior to a process step of forming a comparative layer, and that "the same layer" refers to that one layer is formed in the same process step and is made of the same material as a comparative layer.

The first light-emitting layer Q1 is a quantum-dot light-emitting layer that emits red (e.g., a first color) light, the second light-emitting layer J2 is an organic light-emitting layer that emits blue (e.g., a second color) light, the third light-emitting layer Q3 is a quantum-dot light-emitting layer that emits green (e.g., a third color) light, the fourth light-emitting layer Q4 is a quantum-dot light-emitting layer that emits blue light, the fifth light-emitting layer J5 is an organic light-emitting layer that emits red light, and the sixth light-emitting layer J6 is an organic light-emitting layer that emits green light. That is, light of red, blue and green is emitted from the quantum-dot light emitting layers and the organic light-emitting layers.

The first subpixel SP1 includes the first pixel electrode E1 and the first light-emitting layer Q1, the second subpixel SP2 includes the second pixel electrode E2 and the second light-emitting layer J2, the third subpixel SP3 includes the third pixel electrode E3 and the third light-emitting layer Q3, the fourth subpixel SP4 includes the fourth pixel electrode E4 and the fourth light-emitting layer Q4, the fifth subpixel SP5 includes the fifth pixel electrode E5 and the fifth light-emitting layer J5, and the sixth subpixel SP6 includes the sixth pixel electrode E6 and the sixth light-emitting layer J6.

A pixel PX is composed of the first subpixel SP1, third subpixel SP3, and fourth subpixel SP4 arranged in a row direction (e.g., the direction where the scan signal lines Gn extend), the sixth subpixel SP6 adjacent to the first subpixel SP1 in a column direction (e.g., the direction where the data signal lines DL extend), the fifth subpixel SP5 adjacent to the third subpixel SP3 in the column direction, and the second subpixel SP2 adjacent to the fourth subpixel SP4 in the column direction.

Portion (b) of FIG. 3 is a block diagram illustrating a configuration of the display device according to the first embodiment. As illustrated in (b) of FIG. 3, the display device 2 includes a signal processing circuit that processes input signals, and a driver that drives the pixel PX.

The signal processing circuit generates signals (gradation data) corresponding to the respective subpixels in response to input signals (gradation data) of the individual colors corresponding to the respective pixels. To be specific, in response to a red input signal Rx, a blue input signal Bx and a green input signal Gx corresponding to one pixel, the circuit generates the following: a first signal Rq, corresponding to the first subpixel SP1; a second signal Bj, corresponding to the second subpixel SP2; a third signal Gq, corresponding to the third subpixel SP3; a fourth signal Bq, corresponding to the fourth subpixel SP4; a fifth signal Gj, corresponding to the fifth subpixel SP5; and a sixth signal Rj, corresponding to the sixth subpixel SP6. The following describes an instance of each color, 256 gradations (gradation values: 0 to 255).

The driver outputs a voltage signal A1 to the first subpixel SP1 on the basis of the first signal Rq (digital signal), outputs a voltage signal A2 to the second subpixel SP2 on the basis of the second signal Bj (digital signal), outputs a voltage signal A3 to the third subpixel SP3 on the basis of the third signal Gq (digital signal), outputs a voltage signal A4 to the fourth subpixel SP4 on the basis of the fourth signal Bq (digital signal), outputs a voltage signal A5 to the fifth subpixel SP5 on the basis of the fifth signal Gj (digital signal) and outputs a voltage signal A6 to the sixth subpixel SP6 on the basis of the sixth signal Rj (digital signal).

Portion (a) of FIG. 5 illustrates a gradation-luminance characteristic relating to red, (b) of FIG. 5 illustrates a voltage-luminance curve relating to red, (c) of FIG. 5 illustrates a gradation-luminance characteristic relating to blue, (d) of FIG. 5 illustrates a voltage-luminance curve relating to blue, (e) of FIG. 5 illustrates a gradation-luminance characteristic relating to green, and (f) of FIG. 5 illustrates a voltage-luminance curve relating to green.

With regard to (a) of FIG. 5 and (b) of FIG. 5, luminance L (Rx), obtained from the red gradation-luminance characteristic, TLR, and corresponding to the red input signal Rx, is equal to the sum of luminance L1, obtained from the red gradation-luminance characteristic TLR and corresponding to the first signal Rq, and luminance L6, obtained from the red gradation-luminance characteristic TLR and corresponding to the sixth signal Rj. Each of the gradation-luminance characteristic of the first subpixel and the gradation-luminance characteristic of the sixth subpixel is set to the red gradation-luminance characteristic TLR. Doing so can reproduce the red gradation-luminance characteristic TLR with the light emission in only the first subpixel or sixth subpixel. The luminance L1 is a value corresponding to A1 in a voltage-luminance curve VLRq for the first subpixel, and the luminance L6 is a value corresponding to A6 in a voltage-luminance curve VLRj for the sixth subpixel.

With regard to (c) of FIG. 5 and (d) of FIG. 5, luminance L (Bx), obtained from the blue gradation-luminance characteristic, TLB, and corresponding to the blue input signal Bx, is equal to the sum of luminance L4, obtained from the blue gradation-luminance characteristic TLB and corresponding to the fourth signal Bq, and luminance L2, obtained from the blue gradation-luminance characteristic TLB and corresponding to the second signal Bj. Each of the gradation-luminance characteristic of the second subpixel and the gradation-luminance characteristic of the fourth subpixel is set to the blue gradation-luminance characteristic TLB. Doing so can reproduce the blue gradation-luminance characteristic TLB with the light emission in only the second subpixel or fourth subpixel. The luminance L4 is a value corresponding to A4 in a voltage-luminance curve VLBq for the fourth subpixel, and the luminance L2 is a value corresponding to A2 in a voltage-luminance curve VLBj for the second subpixel.

With regard to (e) of FIG. 5 and (f) of FIG. 5, luminance L (Gx), obtained from the green gradation-luminance characteristic, TLG, and corresponding to the green input signal Gx, is equal to the sum of luminance L3, obtained from the green gradation-luminance characteristic TLG and corresponding to the third signal Gq, and luminance L5, obtained from the green gradation-luminance characteristic TLG and corresponding to the fifth signal Gj. Each of the gradation-luminance characteristic of the third subpixel and the gradation-luminance characteristic of the fifth subpixel is set to the green gradation-luminance characteristic TLG. Doing so can reproduce the green gradation-luminance characteristic TLG with the light emission in only the third subpixel or fifth subpixel. The luminance L3 is a value corresponding to A3 in a voltage-luminance curve VLGq for the third subpixel, and the luminance L5 is a value corresponding to A5 in a voltage-luminance curve VLGj for the fifth subpixel.

The luminance L (Rx) corresponding to the red input signal (Rx) can be calculated using the red gradation-luminance characteristic TLR, and the red input signal Rx corresponding to the luminance L (Rx) can be calculated using an inverse function. Furthermore, for instance, once L6 is determined from the sixth signal Rj and the red gradation-luminance characteristic TLR, the luminance L (Rx)−L6=L1 is established, and the first signal Rq can be hence calculated using an inverse function. These calculations may use a look-up table.

Likewise, the luminance L (Bx) corresponding to the blue input signal (Bx) can be calculated using the blue gradation-luminance characteristic TLB, and the blue input signal Bx corresponding to the luminance L (Bx) can be calculated using an inverse function. Furthermore, for instance, once L2 is determined from the second signal Bj and the blue gradation-luminance characteristic TLB, the luminance L (Bx)−L2=L4 is established, and the fourth signal Bq can be hence calculated using an inverse function. Further, the luminance L (Gx) corresponding to the green input signal (Gx) can be calculated using the green gradation-luminance characteristic TLG, and the green input signal Gx corresponding to the luminance L (Gx) can be calculated using an inverse function. Furthermore, for instance, once L5 is determined from the fifth signal Gj and the green gradation-luminance characteristic TLG, the luminance L (Gx)−L5=L3 is established, and the third signal Gq can be hence calculated using an inverse function.

First Control Method

A first control method, which aims to, by way of example, prevent degradation of an organic light-emitting layer, controls the amount of light emission in a quantum-dot light-emitting layer and in an organic light-emitting layer on the basis of the gradation difference in input signal between pixels. Portion (a) of FIG. 6 is a schematic diagram illustrating a method of processing a red input signal in the first control method, (b) of FIG. 6 is a schematic diagram illustrating a method of processing a blue input signal in the first control method, and (c) of FIG. 6 is a schematic diagram illustrating a method of processing a green input signal in the first control method.

In (a) of FIG. 6, when the red input signal Rx in the pixel PX is greater than a red gradation average in an image region of 3×3 pixels including the pixel PX, the sixth signal Rj is rendered equal to the red gradation average, and when the red input signal Rx of the pixel PX is smaller than the red gradation average, the sixth signal Rj is rendered equal to the red input signal Rx. For Rx=200 and the gradation average=60 for instance, the sixth signal Rj is rendered equal to 60, and for Rx=20 and the gradation average=30, the sixth signal Rj is rendered equal to 20. The first signal Rq can be determined using the red gradation-luminance characteristic TLR.

In (b) of FIG. 6, when the blue input signal Bx in the pixel PX is greater than a blue gradation average in an image region of 3×3 pixels including the pixel PX, the second signal Bj is rendered equal to the blue gradation average, and when the blue input signal Bx in the pixel PX is smaller than the blue gradation average, the second signal Rj is rendered equal to the blue input signal Bx. For Bx=150 and the gradation average=100 for instance, the second signal Bj is rendered equal to 100, and for Bx=30 and the gradation average=40, the second signal Bj is rendered equal to 30.

The fourth signal Bq can be determined using the blue gradation-luminance characteristic TLB.

In (c) of FIG. 6, when the green input signal Gx in the pixel PX is greater than a green gradation average in an image region of 3×3 pixels including the pixel PX, the fifth signal Gj is rendered equal to the green gradation average, and when the green input signal Gx in the pixel PX is smaller than the green gradation average, the fifth signal Gj is rendered equal to the green input signal Gx. For Gx=200 and the gradation average=70 for instance, the fifth signal Gj is rendered equal to 70, and for Gx=40 and the gradation average=60, the fifth signal Gj is rendered equal to 40. The third signal Gq can be determined using the green gradation-luminance characteristic TLG.

FIG. 7 is a schematic diagram illustrating another method of processing a red input signal in the first control method. In FIG. 7, an image region including the pixel PX undergoes red input signal-targeted filtering (using a two-dimensional low-pass filter LPF for instance); moreover, when the red input signal Rx in the pixel PX is greater than a red filtering value in the pixel PX, the sixth signal Rj is rendered equal to the red filtering value, and when the red input signal in the pixel PX is equal to or smaller than the red filtering value in the pixel PX, the sixth signal Rj is rendered equal to the red input signal Rx (the gradation value of the first signal Rq is rendered zero). For Rx=200 and the filtering value=70 for instance, the sixth signal Rj is rendered equal to 70, and for Rx=10 and the filtering value=22 for instance, the sixth signal Rj is rendered equal to 10 (Rq=0). The first signal Rq can be determined using the red gradation-luminance characteristic TLR.

FIG. 8 is a schematic diagram illustrating another method of processing a blue input signal in the first control method. In FIG. 8, an image region including the pixel PX undergoes blue input signal-targeted filtering (using a two-dimensional low-pass filter LPF for instance); moreover, when the blue input signal Bx in the pixel PX is greater than a blue filtering value in the pixel PX, the second signal Bj is rendered equal to the blue filtering value, and when the blue input signal in the pixel PX is equal to or smaller than the blue filtering value in the pixel PX, the second signal Bj is rendered equal to the blue input signal Bx (the gradation value of the fourth signal Bq is rendered zero). For Bx=200 and the filtering value=70 for instance, the second signal Bj is rendered equal to 70, and for Bx=10 and the filtering value=22 for instance, the second signal Bj is rendered equal to 10 (Bq=0). The fourth signal Bq can be determined using the blue gradation-luminance characteristic TLB.

FIG. 9 is a schematic diagram illustrating another method of processing a green input signal in the first control method. In FIG. 9, an image region including the pixel PX undergoes a green input signal-targeted filtering (using a two-dimensional low-pass filter LPF for instance); moreover, when the green input signal Gx in the pixel PX is greater than a green filtering value in the pixel PX, the fifth signal Gj is rendered equal to the green filtering value, and when the green input signal in the pixel PX is equal to or smaller than the green filtering value in the pixel PX, the fifth signal G is rendered equal to the green input signal Gx (the gradation value of the third signal Gq is rendered zero). For Gx=200 and the filtering value=70 for instance, the fifth signal Gj is rendered equal to 70, and for Gx=10 and the filtering value=22 for instance, the fifth signal Gj is rendered equal to 10 (Gq=0). The third signal Gq can be determined using the green gradation-luminance characteristic TLG.

It is noted that the filtering can use a high-pass filter. In this case, the first signal Rq, the fourth signal Bq, and the third signal Gq can be calculated based on, for instance, the difference between a filtering value and an input signal.

The first control method can prevent degradation of organic light-emitting layers of three colors (J2, J5, J6), thus reducing burn-in caused by variations in degradation between pixels. Further, the efficiency of light extraction from each of quantum-dot light-emitting layers and organic light-emitting layers can be enhanced.

It is noted that although the pixel regions (blocks) in FIG. 6 have a size of three pixels by three pixels, any size can be set, including 10 pixels by 10 pixels. Further, the number of LPF taps in FIG. 7 to FIG. 9 is merely illustrative; any number can be set.

Second Control Method

A second control method, which aims to, by way of example, improve the display quality of a low gradation region, prioritizes the light emission in a quantum-dot light-emitting layer in a low gradation region and prioritizes the light emission in an organic light-emitting layer in a high gradation region. Portion (a) of FIG. 10 is a schematic diagram illustrating a method of processing a red input signal in the second control method, (b) of FIG. 10 is a schematic diagram illustrating a method of processing a blue input signal in the second control method, and (c) of FIG. 10 is a schematic diagram illustrating a method of processing a green input signal in the second control method.

In (a) of FIG. 10, with regard to the pixel PX, the gradation value of the first signal Rq is rendered higher than the gradation value of the sixth signal Gj when the gradation value of the red input signal Rx is lower than a red threshold Rt, and the gradation value Rq of the first signal is rendered lower than the gradation value Rj of the fifth signal when the red input signal Rx is higher than the red threshold Rt. For the red threshold Rt>Rx=20 for instance, the first signal Rq is rendered equal to 20, and the sixth signal Gj is rendered equal to zero, and for the red threshold Rt<Rx=200 for instance, the sixth signal Rj is rendered higher than the first signal Rq.

In (b) of FIG. 10, with regard to the pixel PX, the gradation value of the fourth signal Bq is rendered higher than the gradation value of the second signal Bj when the gradation value of the blue input signal Bx is lower than a blue threshold Bt, and the gradation value Bq of the fourth signal is rendered lower than the gradation value Bj of the second signal when the blue input signal Bx is higher than the blue threshold Bt. For the blue threshold Bt>Bx=30 for instance, the fourth signal Bq is rendered equal to 30, and the second signal Bj is rendered equal to zero, and for the blue threshold Bt<Bx=230 for instance, the second signal Bj is rendered higher than the fourth signal Bq.

In (c) of FIG. 10, with regard to the pixel PX, the gradation value of the third signal Gq is rendered higher than the gradation value of the fifth signal Gj when the gradation value of the green input signal Gx is lower than a green threshold Gt, and the gradation value Gq of the third signal is rendered lower than the gradation value Gj of the sixth signal when the green input signal Gx is higher than the green threshold Gt. For the green threshold Gt>Gx=30 for instance, the third signal Gq is rendered equal to 30, and the fifth signal Gj is rendered equal to zero, and for the green threshold Gt<Gx=230 for instance, the fifth signal Gj is rendered higher than the third signal Gq. The second control method enables a low gradation region, which is difficult to undergo gradation control with organic light-emitting layers of three colors (J2, J5, J6), to be displayed with a quantum-dot light-emitting layer (Q1, Q3, Q4) and enables an organic light-emitting layer J2, J5, J6), which has high light emission efficiency, to preferentially emit light in a high gradation region, thus improving the display quality of the low gradation region and saving the consumed power in the high gradation region.

Third Control Method

A third control method, which aims to, by way of example, enlarge a color reproduction range, controls the amount of light emission in a quantum-dot light-emitting layer and in an organic light-emitting layer in accordance with a display-color-gamut mode of a display device. Portion (a) of FIG. 11 is a graph showing a color gamut of a light-emitting element (OLED) having an organic light-emitting layer, and a color gamut of a light-emitting element (QLED) having a quantum-dot light-emitting layer, (b) of FIG. 11 is a schematic diagram illustrating a method of processing a red input signal in the third control method, (c) of FIG. 11 is a schematic diagram illustrating a method of processing a blue input signal in the third control method, and (d) of FIG. 11 is a schematic diagram illustrating a method of processing a green input signal in the third control method.

As illustrated in (a) of FIG. 11, the display device 2 can use a color gamut of a light-emitting element (OLED) having an organic light-emitting layer, and a color gamut of a light-emitting element (QLED) having a quantum-dot light-emitting layer.

In (b) of FIG. 11, the gradation values of the first signal Rq and sixth signal Rj with respect to the red input signal Rx are set in accordance with a display-color-gamut mode. For Rx=255, Bx=0, and Gx=0 for instance, when the display device 2 is in a first display-color-gamut mode, the first signal Rq is rendered equal to 255, and the sixth signal Rj is rendered equal to zero, and when the display device 2 is in a second display-color-gamut mode, the first signal Rq is rendered equal to zero, and the sixth signal Rj is rendered equal to 255.

In (c) of FIG. 11, the gradation values of the fourth signal Bq and second signal Bj with respect to the blue input signal Bx are set in accordance with a display-color-gamut mode. For Rx=0, Bx=255, and Gx=0 for instance, when the display device 2 is in the first display-color-gamut mode, the fourth signal Bq is rendered equal to 255, and the second signal Bj is rendered equal to zero, and when the display device 2 is in the second display-color-gamut mode, the fourth signal Bq is rendered equal to zero, and the second signal Bj is rendered equal to 255.

In (d) of FIG. 11, the gradation values of the third signal Gq and fifth signal Gj with respect to the green input signal Gx are set in accordance with a display-color-gamut mode. For Rx=0, Bx=0, and Gx=255 for instance, when the display device 2 is in the first display-color-gamut mode, the third signal Gq is rendered equal to 255, and the fifth signal Gj is rendered equal to zero, and when the display device 2 is in the second display-color-gamut mode, the third signal Gq is rendered equal to zero, and the fifth signal Gj is rendered equal to 255.

The third control method can adjust a color reproduction range by switching between the light emission in a quantum-dot light-emitting layer (Q1, Q4, Q3) and the light emission in an organic light-emitting layer (J2, J5, J6) in accordance with a display-color-gamut mode.

Fourth Control Method

A fourth control method, which aims to, by way of example, prevent degradation of an organic light-emitting layer, prevents the amount of light emission in an organic light-emitting layer at peak luminance. Portion (a) of FIG. 12 is a schematic diagram illustrating a method of processing a red input signal in the fourth control method, (b) of FIG. 12 is a schematic diagram illustrating a method of processing a blue input signal in the fourth control method, and (c) of FIG. 12 is a schematic diagram illustrating a method of processing a green input signal in the fourth control method.

In (a) of FIG. 12, an image region including the pixel PX undergoes red input signal-targeted filtering (using a two-dimensional low-pass filter LPF for instance); moreover, when the red input signal Rx in the pixel PX is greater than a red filtering value in the pixel PX, the sixth signal Rj is rendered equal to the red filtering value. For Rx=250 and the filtering value=210 for instance, the sixth signal Rj is rendered equal to 210. The first signal Rq can be determined using the red gradation-luminance characteristic TLR.

In (b) of FIG. 12, an image region including the pixel PX undergoes blue input signal-targeted filtering (using a two-dimensional low-pass filter LPF for instance); moreover, when the blue input signal Bx in the pixel PX is greater than a blue filtering value in the pixel PX, the second signal Bj is rendered equal to the blue filtering value. For Bx=250 and the filtering value=210 for instance, the second signal Bj is rendered equal to 210. The fourth signal Bq can be determined using the blue gradation-luminance characteristic TLB.

In (c) of FIG. 12, an image region including the pixel PX undergoes a green input signal-targeted filtering (using a two-dimensional low-pass filter LPF for instance); moreover, when the green input signal Gx in the pixel PX is greater than a green filtering value in the pixel PX, the fifth signal Gj is rendered equal to the green filtering value. For Gx=250 and the filtering value=210 for instance, the fifth signal Gj is rendered equal to 210. The third signal Gq can be determined using the green gradation-luminance characteristic TLG.

The fourth control method can prevent degradation of an organic light-emitting layer during peak luminance display, and can improve color reproducibility by lighting a quantum-dot light-emitting layer.

Fifth Control Method

Portion (a) of FIG. 13 is a schematic diagram illustrating a method of processing a red input signal in a fifth control method, (b) of FIG. 13 is a schematic diagram illustrating a method of processing a blue input signal in the fifth control method, and (c) of FIG. 13 is a schematic diagram illustrating a method of processing a green input signal in the fifth control method. The fifth control method, which aims to, by way of example, improve the display quality of a moving image, combines the hold-type light emission of an organic light-emitting layer and an impulse-type light emission of a quantum-dot light-emitting layer.

In (a) of FIG. 13, the driver performs, with regard to the pixel PX, impulse control on the first subpixel SP1 on the basis of the first signal Rq, and hold control on the sixth subpixel SP6 on the basis of the sixth signal Gj. For Rx=20 (Rx is a low gradation region) for instance, the first subpixel SP1 is rendered lit during only one-third of one frame period (impulse control) on the basis of the first signal Rq=60 and the sixth signal Gj=0. Further, for Rx=120 (Rx is not a low gradation region), on the basis of, for instance, the first signal Rq=180 and the sixth signal Rj=50, the first subpixel SP1 is rendered lit during only one-third of one frame period (impulse control), and the sixth subpixel SP6 is rendered lit during one frame period (hold control). In this case, a relationship is established that is luminance corresponding to Rx of the gradation-luminance characteristic TLR=(luminance corresponding to Rq of the gradation-luminance characteristic TLR)×⅓+luminance corresponding to Rj of the gradation-luminance characteristic TLR.

In (b) of FIG. 13, the driver performs, with regard to the pixel PX, impulse control on the fourth subpixel SP4 on the basis of the fourth signal Bq, and hold control on the second subpixel SP2 on the basis of the second signal Bj. For Bx=60 (Bx is a low gradation region) for instance, the fourth subpixel SP4 is rendered lit during only one-third of one frame period (impulse control) on the basis of the fourth signal Bq=60 and the second signal Bj=0. Further, for Bx=120 (Bx is not a low gradation region), on the basis of, for instance, the fourth signal Bq=180 and the second signal Bj=50, the fourth subpixel SP4 is rendered lit during only one-third of one frame period (impulse control), and the second subpixel SP2 is rendered lit during one frame period (hold control). In this case, a relationship is established that is luminance corresponding to Bx of the gradation-luminance characteristic TLB=(luminance corresponding to Bq of the gradation-luminance characteristic TLB)×⅓+luminance corresponding to Bj of the gradation-luminance characteristic TLB.

In (c) of FIG. 13, the driver performs, with regard to the pixel PX, impulse control on the third subpixel SP3 on the basis of the third signal Gq, and hold control on the fifth subpixel SP5 on the basis of the fifth signal Gj. For Gx=20 (Gx is a low gradation region) for instance, the third subpixel SP3 is rendered lit during only one-third of one frame period (impulse control) on the basis of the third signal Gq=60 and the fifth signal Gj=0. Further, for Gx=120 (Gx is not a low gradation region), on the basis of, for instance, the third signal Gq=180 and the fifth signal Gj=50, the third subpixel SP3 is rendered lit during only one-third of one frame period (impulse control), and the fifth subpixel SP5 is rendered lit during one frame period (hold control). In this case, a relationship is established that is luminance corresponding to Gx of the gradation-luminance characteristic TLG=(luminance corresponding to Gq of the gradation-luminance characteristic TLG)×⅓+luminance corresponding to Gj of the gradation-luminance characteristic TLG.

The fifth control method can improve the display quality of a moving image, can improve display reproducibility in a low gradation region and can prevent degradation of an organic light-emitting layer, by performing impulse control on a quantum-dot light-emitting layer (Q1, Q4, Q3) and hold control on an organic light-emitting layer (J2, J6, J5) in accordance with the gradation values of input signals of the three colors.

Second Embodiment

Portion (a) of FIG. 14 is a plan view of a configuration of a pixel in a second embodiment, and (b) of FIG. 14 is a block diagram of a configuration of a display device in the second embodiment. As illustrated in FIG. 14, the first light-emitting layer Q1 includes a quantum-dot light-emitting layer that emits red light, the third light-emitting layer Q3 includes a quantum-dot light-emitting layer that emits green light, the fourth light-emitting layer Q4 includes a quantum-dot light-emitting layer that emits blue light, the second light-emitting layer J2 includes an organic light-emitting layer that emits blue light, the fifth light-emitting layer J5 includes an organic light-emitting layer that emits green light, and the sixth light-emitting layer J6 includes an organic light-emitting layer that emits red light.

The first subpixel SP1 includes the first pixel electrode E1 and the first light-emitting layer Q1, the third subpixel SP3 includes the third pixel electrode E3 and the third light-emitting layer Q3, the fourth subpixel SP4 includes the fourth pixel electrode E4 and the fourth light-emitting layer Q4, and a seventh subpixel SP7 includes the second pixel electrode E2 and the second light-emitting layer J2. The second light-emitting layer J2 is a white light-emitting layer formed over the second pixel electrode E2 and overlaps the second pixel electrode E2.

The second light-emitting layer J2 may be, for instance, a white light-emitting layer composed of a stack of an organic light-emitting layer that emits red light, an organic light-emitting layer that emits blue light, and an organic light-emitting layer that emits green light or may be, for instance, a white light-emitting layer composed of a mixture of an organic light-emitting substance that emits red light, an organic light-emitting substance that emits blue light, and an organic light-emitting substance that emits green light.

The pixel PX is composed of the first subpixel SP1, the third subpixel SP3, the fourth subpixel SP4, and the seventh subpixel SP7 arranged in a row direction.

In response to a red input signal Rx, a blue input signal Bx, and a green input signal Gx, the signal processing circuit generates the following: a first signal Rq, corresponding to the first subpixel SP1; a third signal Gq, corresponding to the third subpixel SP3; a fourth signal Bq, corresponding to the fourth subpixel SP4; and a seventh signal Wj, corresponding to the seventh subpixel SP7. Hereinafter, the minimum values of Rx, Bx and Gx will be denoted as Wx.

The driver outputs a voltage signal A1 to the first subpixel SP1 on the basis of the first signal Rq (digital signal), outputs a voltage signal A3 to the third subpixel SP3 on the basis of the third signal Gq (digital signal), outputs a voltage signal A4 to the fourth subpixel SP4 on the basis of the fourth signal Bq (digital signal) and outputs voltage signals A7r, A7b and A7g to the seventh subpixel SP7 on the basis of the seventh signal Wj (digital signal).

Portion (a) of FIG. 15 illustrates a gradation-luminance characteristic relating to red, (b) of FIG. 15 illustrates a voltage-luminance curve relating to red, (c) of FIG. 15 illustrates a gradation-luminance characteristic relating to blue, (d) of FIG. 15 illustrates a voltage-luminance curve relating to blue, (e) of FIG. 15 illustrates a gradation-luminance characteristic relating to green, and (f) of FIG. 15 illustrates a voltage-luminance curve relating to green.

With regard to (a) of FIG. 15 and (b) of FIG. 15, luminance L (Rx), obtained from the red gradation-luminance characteristic TLR and corresponding to the red input signal Rx, is equal to the sum of luminance L1, obtained from the red gradation-luminance characteristic TLR and corresponding to the first signal Rq, and luminance Lr, obtained from the red gradation-luminance characteristic TLR and corresponding to the seventh signal Wj. The luminance L1 is a value corresponding to A1 in a voltage-luminance curve VLRq for the first subpixel, and the luminance Lr is a value corresponding to A7r in a voltage-luminance curve VLRj for the red organic light-emitting layer.

With regard to (c) of FIG. 15 and (d) of FIG. 15, luminance L (Bx), obtained from the blue gradation-luminance characteristic TLB and corresponding to the blue input signal Bx, is equal to the sum of luminance L4, obtained from the blue gradation-luminance characteristic TLB and corresponding to the fourth signal Bq, and luminance Lb, obtained from the blue gradation-luminance characteristic TLB and corresponding to the seventh signal Wj. The luminance L4 is a value corresponding to A4 in a voltage-luminance curve VLBq for the fourth subpixel, and the luminance Lb is a value corresponding to A7b in a voltage-luminance curve VLBj for the blue organic light-emitting layer.

With regard to (e) of FIG. 15 and (f) of FIG. 15, luminance L (Gx), obtained from the green gradation-luminance characteristic TLG and corresponding to the green input signal Gx, is equal to the sum of luminance L3, obtained from the green gradation-luminance characteristic TLG and corresponding to the third signal Gq, and luminance Lg, obtained from the green gradation-luminance characteristic TLG and corresponding to the seventh signal Wj. The luminance L3 is a value corresponding to A3 in a voltage-luminance curve VLGq for the third subpixel, and the luminance Lg is a value corresponding to A7g in a voltage-luminance curve VLGj for the green organic light-emitting layer.

Sixth Control Method

FIG. 16 is a schematic diagram illustrating a method of processing red, blue and green input signals in a sixth control method. In FIG. 16, when a white input signal Wx in the pixel PX is greater than a white gradation average in an image region including the pixel PX, the seventh signal Wj is rendered equal to the white gradation average. Further, the seventh signal Wj is rendered equal to the white input signal Wx when the white input signal Wx in the pixel PX is smaller than the white gradation average in the image region including the pixel PX.

For Wx=110 and the gradation average=30<Wx for instance, the seventh signal Wj is rendered equal to 30, as illustrated in (a) of FIG. 16. Further, for Wx=40 and the gradation average=50>Wx for instance, the seventh signal Wj is rendered equal to 40, as illustrated in (b) of FIG. 16. The first signal Rq, the fourth signal Bq, and the third signal Gq can be determined using the gradation-luminance characteristics TLR, TLB and TLG (see FIG. 15).

FIG. 17 is a schematic diagram illustrating another method of processing red, blue and green input signals in the sixth control method. In FIG. 17, an image region including the pixel PX undergoes filtering targeted for the white input signal Wx; moreover, when the white input signal Wx in the pixel PX is greater than a white filtering value in the pixel PX, the seventh signal Wj is rendered equal to the white filtering value, and when the white input signal Wx in the pixel PX is equal to or smaller than the white filtering value in the pixel PX, the seventh signal Wj is rendered equal to the white input signal Wx.

For Wx=200 and the filtering value=70<Wx for instance, the seventh signal Wj is rendered equal to 70, as illustrated in (a) of FIG. 17. Further, for Wx=10 and the filtering value=22>Wx for instance, the seventh signal Wj is rendered equal to 10, as illustrated in (b) of FIG. 17. The first signal Rq, the fourth signal Bq, and the third signal Gq can be determined using the gradation-luminance characteristics TLR, TLB and TLG (see FIG. 15).

The sixth control method can prevent degradation of the organic light-emitting layer in the seventh subpixel SP7, thus reducing burn-in caused by variations in degradation between pixels. Although the size of the pixel regions (blocks), the number of LPF taps in FIG. 16, is set to three pixels by three pixels, any size can be set, including 10 pixels by 10 pixels.

Seventh Control Method

Portion (a) of FIG. 18 illustrates a gradation-luminance characteristic relating to white, and (b) of FIG. 18 is a schematic diagram illustrating a method of processing red, blue and green input signals in a seventh control method.

In (a) of FIG. 18, with regard to the pixel PX, the gradation value of the seventh signal Wj is rendered zero when the white input signal Wx in the pixel PX is lower than a white threshold Wt, and the seventh signal Wj is rendered equal to the white input signal Wx when the white input signal Wx in the pixel PX is equal to or greater than the white threshold Wt.

For the white threshold Wt=30 and Wx=20 (<Wt) for instance, the seventh signal Wj is rendered equal to zero, and for Wx=200 (>Wt) for instance, the seventh signal Wj is rendered equal to 200, as illustrated in (b) of FIG. 18. The first signal Rq, the fourth signal Bq, and the third signal Gq can be determined using the gradation-luminance characteristics TLR, TLB and TLG (see FIG. 15).

The seventh control method enables a low gradation region, which is difficult to undergo gradation control with organic light-emitting layers of three colors (J2, J5, J6), to be displayed with a quantum-dot light-emitting layer (Q1, Q3, Q4) and enables an organic light-emitting layer (J2, J5, J6), which has high light emission efficiency, to preferentially emit light in a high gradation region, thus improving the display quality of the low gradation region and saving the consumed power in the high gradation region.

Eighth Control Method

FIG. 19 is a schematic diagram illustrating a method of processing red, blue and green input signals in an eighth control method.

In FIG. 19, an image region including the pixel PX undergoes white input signal-targeted filtering (using a two-dimensional low-pass filter LPF for instance), moreover, when the white input signal Wx in the pixel PX is greater than a white filtering value in the pixel PX, the seventh signal Wj is rendered equal to the white filtering value. For Wx=250 and the filtering value=210 for instance, the seventh signal Wj is rendered equal to 210. The first signal Rq, the fourth signal Bq, and the third signal Gq can be determined using the gradation-luminance characteristics TLR, TLB and TLG (see FIG. 15).

The eighth control method can prevent degradation of an organic light-emitting layer during peak luminance display, can save consumed power by lighting the organic light-emitting layer and can improve color reproducibility by lighting a quantum-dot light-emitting layer.

Ninth Control Method

FIG. 20 is a schematic diagram illustrating a method of processing red, blue and green input signals in a ninth control method. In FIG. 20, the driver performs, on the pixel PX, impulse control based on the first signal Rq, the fourth signal Bq, and the third signal Gq, and hold control based on the seventh signal Wj.

For Wx=20 (Wx is a low gradation region) for instance, the first subpixel SP1, the fourth subpixel SP4, and the third subpixel SP3 are rendered lit during only one-third of one frame period (impulse control) on the basis of the first signal Rq=60, the fourth signal Bq=90, the third signal Gq=90, and the seventh signal Wj=0, as illustrated in (a) of FIG. 20.

Further, for Wx=120 (Wx is not a low gradation region) for instance, on the basis of, for instance, the first signal Rq=190, the fourth signal Bq=190, the third signal Gq=100, and the seventh signal Wj=90, the first subpixel SP1, the fourth subpixel SP4, and the third subpixel SP3 are rendered lit during only one-third of one frame period (impulse control), and the seventh subpixel SP7 is rendered lit during one frame period (hold control), as illustrated in (b) of FIG. 20.

In this case, relationships are established that are luminance corresponding to Rx of the gradation-luminance characteristic TLR=(luminance corresponding to Rq of the gradation-luminance characteristic TLR)×⅓+luminance corresponding to Wj of the gradation-luminance characteristic TLR, luminance corresponding to Bx of the gradation-luminance characteristic TLB=(luminance corresponding to Bq of the gradation-luminance characteristic TLB)×⅓+luminance corresponding to Wj of the gradation-luminance characteristic TLB, and luminance corresponding to Gx of the gradation-luminance characteristic TLG=(luminance corresponding to Gq of the gradation-luminance characteristic TLG)×⅓+luminance corresponding to Wj of the gradation-luminance characteristic TLG.

The ninth control method can improve the display quality of a moving image, can improve display reproducibility in a low gradation region and can prevent degradation of an organic light-emitting layer, by performing impulse control on a quantum-dot light-emitting layer (Q1, Q4, Q3) and hold control on an organic light-emitting layer (J2, J6, J5) in accordance with the gradation values of input signals of the three colors.

Third Embodiment

Portion (a) of FIG. 21 is a plan view of a configuration of a pixel in a third embodiment, and (b) of FIG. 21 is a block diagram of a configuration of a display device in the third embodiment. As illustrated in FIG. 21, the first light-emitting layer Q1 includes a quantum-dot light-emitting layer that emits red (e.g., red) light, the second light-emitting layer J2 includes an organic light-emitting layer that emits blue (e.g., blue) light, and the third light-emitting layer Q3 includes a quantum-dot light-emitting layer that emits green (e.g., green) light.

The first subpixel SP1 includes the first pixel electrode E1 and the first light-emitting layer Q1, the second subpixel SP2 includes the second pixel electrode E2 and the second light-emitting layer J2, and the third subpixel SP3 includes the third pixel electrode E3 and the third light-emitting layer Q3.

The pixel PX is composed of the first subpixel SP1, the third subpixel SP3, and the second subpixel SP2 arranged in a row direction.

In response to a red input signal Rx, a blue input signal Bx, and a green input signal Gx, the signal processing circuit generates the following: a first signal Rq, corresponding to the first subpixel SP1; a second signal Bj, corresponding to the second subpixel SP2; and a third signal Gq, corresponding to the third subpixel SP3.

Tenth Control Method

FIG. 22 is a schematic diagram illustrating a method of processing red, blue and green input signals in a tenth control method. In FIG. 22, the driver performs, on the pixel PX, impulse control based on the first signal Rq and the third signal Gq, and hold control based on the second signal Bj.

For Rx=20, Bx=30, and Gx=30 (Rx, Bx, and Gx are low gradation regions) for instance, the first subpixel SP1 and the third subpixel SP3 are rendered lit during one-third of one frame period (impulse control), and the second subpixel SP2 is rendered lit during one frame period (hold control), on the basis of the first signal Rq=60, the second signal Bj=30, the third signal Gq=90, as illustrated in (a) of FIG. 22.

Further, for Rx=100, Bx=160, and Gx=100 (Rx, Bx, and Gx are not low gradation regions) for instance, the first subpixel SP1 and the third subpixel SP3 are rendered lit during only one-third of one frame period (impulse control), and the second subpixel SP2 is rendered lit during one frame period (hold control), on the basis of the first signal Rq=240, the second signal Bj=160, and the third signal Gq=240, as illustrated in (b) of FIG. 22.

The tenth control method can improve the display quality of a moving image, can improve display reproducibility in a low gradation region and can prevent degradation of an organic light-emitting layer, by performing impulse control on a quantum-dot light-emitting layer (Q1, Q3) and hold control on an organic light-emitting layer (J2) in accordance with the gradation values of input signals of the three colors.

Fourth Embodiment

Portion (a) of FIG. 23 is a plan view of a configuration of a pixel in a fourth embodiment, and (b) of FIG. 23 is a block diagram of a configuration of a display device in the fourth embodiment. As illustrated in FIG. 23, the first light-emitting layer Q1 includes a quantum-dot light-emitting layer that emits red light, the second light-emitting layer J2 includes an organic light-emitting layer that emits blue light, the third light-emitting layer Q3 includes a quantum-dot light-emitting layer that emits green light, and the fifth light-emitting layer J5 includes an organic light-emitting layer that emits green light.

The first subpixel SP1 includes the first pixel electrode E1 and the first light-emitting layer Q1, the second subpixel SP2 includes the second pixel electrode E2 and the second light-emitting layer J2, the third subpixel SP3 includes the third pixel electrode E3 and the third light-emitting layer Q3, and the fifth subpixel SP5 includes the fifth pixel electrode E5 and the fifth light-emitting layer J5.

The pixel PX is composed of the first subpixel SP1, the third subpixel SP3, the fifth subpixel SP5, and the second subpixel SP2 arranged in a row direction.

In response to a red input signal Rx, a blue input signal Bx, and a green input signal Gx, the signal processing circuit generates the following: a first signal Rq, corresponding to the first subpixel SP1; a second signal Bj, corresponding to the second subpixel SP2; a third signal Gq, corresponding to the third subpixel SP3; and a fifth signal Gj, corresponding to the fifth subpixel SP5.

The first control method, the second control method, the third control method, the fourth control method, and the fifth control method described in the first embodiment can be performed in this embodiment.

First Control Method

In the fourth embodiment, the control methods in (c) of FIG. 6 and FIG. 9 can be applied to the third signal Gq, corresponding to the third subpixel SP3, and the fifth signal Gj, corresponding to the fifth subpixel SP5.

Second Control Method

In the fourth embodiment, the control method in (c) of FIG. 10 can be applied to the third signal Gq, corresponding to the third subpixel SP3, and the fifth signal Gj, corresponding to the fifth subpixel SP5.

Third Control Method

In the fourth embodiment, the control method in (d) of FIG. 11 can be applied to the third signal Gq, corresponding to the third subpixel SP3, and the fifth signal Gj, corresponding to the fifth subpixel SP5.

Fourth Control Method

In the fourth embodiment, the control method in (c) of FIG. 12 can be applied to the third signal Gq, corresponding to the third subpixel SP3, and the fifth signal Gj, corresponding to the fifth subpixel SP5.

Fifth Control Method

In the fourth embodiment, the control method in (c) of FIG. 13 can be applied to the third signal Gq, corresponding to the third subpixel SP3, and the fifth signal Gj, corresponding to the fifth subpixel SP5.

Fifth Embodiment

Portion (a) of FIG. 24 is a plan view of a configuration of a pixel in a fifth embodiment, and (b) of FIG. 24 is a block diagram of a configuration of a display device in the fifth embodiment. As illustrated in FIG. 24, the first light-emitting layer Q1 includes a quantum-dot light-emitting layer that emits red light, the second light-emitting layer J2 includes an organic light-emitting layer that emits blue light, the third light-emitting layer Q3 includes a quantum-dot light-emitting layer that emits green light, and the fourth light-emitting layer Q4 includes a quantum-dot light-emitting layer that emits blue light.

The first subpixel SP1 includes the first pixel electrode E1 and the first light-emitting layer Q1, the second subpixel SP2 includes the second pixel electrode E2 and the second light-emitting layer J2, the third subpixel SP3 includes the third pixel electrode E3 and the third light-emitting layer Q3, and the fourth subpixel SP4 includes the fourth pixel electrode E4 and the fourth light-emitting layer Q4.

The pixel PX is composed of the first subpixel SP1 and the fourth subpixel SP4 arranged in a row direction, the second subpixel SP2 adjacent to the first subpixel SP1 in a column direction, and the third subpixel SP3 adjacent to the fourth subpixel SP4 in the column direction.

In response to a red input signal Rx, a blue input signal Bx, and a green input signal Gx, the signal processing circuit generates the following: a first signal Rq, corresponding to the first subpixel SP1; a second signal Bj, corresponding to the second subpixel SP2; a third signal Gq, corresponding to the third subpixel SP3; and a fourth signal Bq, corresponding to the fourth subpixel SP4.

The first control method, the second control method, the third control method, the fourth control method, and the fifth control method described in the first embodiment can be performed in this embodiment.

First Control Method

In the fifth embodiment, the control methods in (b) of FIG. 6 and FIG. 8 can be applied to the second signal Bj, corresponding to the second subpixel SP2, and the fourth signal Bq, corresponding to the fourth subpixel SP4.

Second Control Method

In the fifth embodiment, the control method in (b) of FIG. 10 can be applied to the second signal Bj, corresponding to the second subpixel SP2, and the fourth signal Bq, corresponding to the fourth subpixel SP4.

Third Control Method

In the fifth embodiment, the control method in (c) of FIG. 11 can be applied to the second signal Bj, corresponding to the second subpixel SP2, and the fourth signal Bq, corresponding to the fourth subpixel SP4.

Fourth Control Method

In the fifth embodiment, the control method in (b) of FIG. 12 can be applied to the second signal Bj, corresponding to the second subpixel SP2, and the fourth signal Bq, corresponding to the fourth subpixel SP4.

Fifth Control Method

In the fifth embodiment, the control method in (b) of FIG. 13 can be applied to the second signal Bj, corresponding to the second subpixel SP2, and the fourth signal Bq, corresponding to the fourth subpixel SP4.

The foregoing embodiments are illustrative and descriptive and are thus not restrictive. One of ordinary skill in the art will obviously understand that numerous modifications can be devised based on these illustrations and descriptions.

The invention claimed is:

1. A display device comprising:
   a first pixel electrode electrically connected to a first transistor;
   a second pixel electrode electrically connected to a second transistor and formed in a same layer as the first pixel electrode;
   a first light-emitting layer formed over the first pixel electrode and overlapping the first pixel electrode; and
   a second light-emitting layer formed over the second pixel electrode and overlapping the second pixel electrode,
   wherein the first light-emitting layer includes a quantum-dot light-emitting layer that emits light of a first color, and
   the second light-emitting layer includes an organic light-emitting layer that emits light of a second color different from the first color,
   the display device further comprising:
   a first subpixel including the first pixel electrode;
   a second subpixel including the second pixel electrode;
   a signal processing circuit configured to generate a first signal corresponding to the first subpixel, and a second signal corresponding to the second subpixel in response to an input signal of the first color and an input signal of the second color;
   a fourth pixel electrode electrically connected to a fourth transistor and formed in a same layer as the first pixel electrode;
   a fourth light-emitting layer formed over the fourth pixel electrode and overlapping the fourth pixel electrode;
   wherein the fourth light-emitting layer includes a quantum-dot light-emitting layer that emits light of the second color, and
   the display device further comprising:
   a fourth subpixel including the fourth pixel electrode, wherein the signal processing circuit further generates a fourth signal corresponding to the fourth subpixel; and
   a driver configured to perform a hold control based on the second signal, and an impulse control based on the fourth signal.

2. The display device according to claim 1, wherein:
   with regard to a pixel including the second subpixel and the fourth subpixel,
   second-color luminance corresponding to the input signal of the second color is equal to a sum of second-subpixel luminance corresponding to the second signal and fourth-subpixel luminance corresponding to the fourth signal; and
   when the input signal of the second color in the pixel is greater than a second-color gradation average in an image region including the pixel, the signal processing circuit renders the second signal equal to the second-color gradation average.

3. The display device according to claim 1, wherein:
   with regard to a pixel including the second subpixel and the fourth subpixel,
   second-color luminance corresponding to the input signal of the second color is equal to a sum of second-subpixel luminance corresponding to the second signal and fourth-subpixel luminance corresponding to the fourth signal; and the signal processing circuit further performs second-color input signal-targeted filtering on an image region including the pixel, wherein the signal processing circuit renders, when the input signal of the second color in the pixel is greater than a second-color filtering value in the pixel, the second signal equal to the second-color filtering value, and the signal processing circuit renders a gradation value of the fourth signal to zero when the input signal of the second color in the pixel is equal to or smaller than the second-color filtering value in the pixel.

4. The display device according to claim 1, wherein:

with regard to a pixel including the second subpixel and the fourth subpixel, second-color luminance corresponding to the input signal of the second color is equal to a sum of second-subpixel luminance corresponding to the second signal and fourth-subpixel luminance corresponding to the fourth signal; and the signal processing circuit renders the fourth signal as a higher gradation value than the second signal when the input signal of the second color in the pixel is lower than a second-color threshold.

5. The display device according to claim 1, wherein:

with regard to a pixel including the second subpixel and the fourth subpixel, second-color luminance corresponding to the input signal of the second color is equal to a sum of second-subpixel luminance corresponding to the second signal and fourth-subpixel luminance corresponding to the fourth signal; and the signal processing circuit renders the second signal as a higher gradation value than the fourth signal when the input signal of the second color in the pixel is equal to or greater than a second-color threshold.

6. The display device according to claim 1, wherein:

with regard to a pixel including the second subpixel and the fourth subpixel, second-color luminance corresponding to the input signal of the second color is equal to a sum of second-subpixel luminance corresponding to the second signal and fourth-subpixel luminance corresponding to the fourth signal; and the signal processing circuit sets second-signal and fourth-signal gradation values with respect to the input signal of the second color in accordance with a display-color-gamut mode.

7. A display device comprising:

a first pixel electrode electrically connected to a first transistor;

a second pixel electrode electrically connected to a second transistor and formed in a same layer as the first pixel electrode;

a first light-emitting layer formed over the first pixel electrode and overlapping the first pixel electrode; and a second light-emitting layer formed over the second pixel electrode and overlapping the second pixel electrode, wherein the first light-emitting layer includes a quantum-dot light-emitting layer that emits light of a first color, and the second light-emitting layer includes an organic light-emitting layer that emits light of a second color different from the first color, the display device further comprising:

a first subpixel including the first pixel electrode;

a second subpixel including the second pixel electrode;

a signal processing circuit configured to generate a first signal corresponding to the first subpixel, and a second signal corresponding to the second subpixel in response to an input signal of the first color and an input signal of the second color;

a third pixel electrode electrically connected to a third transistor and formed in a same layer as the first pixel electrode; and a third light-emitting layer formed over the third pixel electrode and overlapping the third pixel electrode, wherein the third light-emitting layer includes a quantum-dot light-emitting layer that emits light of a third color different from the first color and the second color, the display device further comprising:

a third subpixel including the third pixel electrode, wherein the signal processing circuit generates a third signal corresponding to the third subpixel in response to an input signal of a third color, the display device further comprising:

a fourth pixel electrode electrically connected to a fourth transistor and formed in a same layer as the first pixel electrode;

a fifth pixel electrode electrically connected to a fifth transistor and formed in a same layer as the first pixel electrode;

a sixth pixel electrode electrically connected to a sixth transistor and formed in a same layer as the first pixel electrode;

a fourth light-emitting layer formed over the fourth pixel electrode and overlapping the fourth pixel electrode;

a fifth light-emitting layer formed over the fifth pixel electrode and overlapping the fifth pixel electrode;

a sixth light-emitting layer formed over the sixth pixel electrode and overlapping the sixth pixel electrode, wherein the fourth light-emitting layer includes a quantum-dot light-emitting layer that emits light of the second color, the fifth light-emitting layer includes an organic light-emitting layer that emits light of the third color, and the sixth light-emitting layer includes an organic light-emitting layer that emits light of the first color, the display device further comprising:

a fourth subpixel including the fourth pixel electrode;

a fifth subpixel including the fifth pixel electrode; and a sixth subpixel including the sixth pixel electrode, wherein the signal processing circuit generates a fourth signal corresponding to the fourth subpixel, a fifth signal corresponding to the fifth subpixel, and a sixth signal corresponding to the sixth subpixel, and the display device further comprising:

a driver configured to perform a hold control based on the second signal, the fifth signal, and the sixth signal, and an impulse control based on the first signal, the third signal, and the fourth signal.

8. The display device according to claim 7, wherein:

with regard to a pixel including the first subpixel, the second subpixel, the third subpixel, the fourth subpixel, the fifth subpixel, and the sixth subpixel, first-color luminance corresponding to the input signal of the first color is equal to a sum of first-subpixel luminance corresponding to the first signal and sixth-subpixel luminance corresponding to the sixth signal, second-color luminance corresponding to the input signal of the second color is equal to a sum of second-subpixel luminance corresponding to the second signal and fourth-subpixel luminance corresponding to the fourth signal, and third-color luminance corresponding to the input signal of the third color is equal to a sum of third-subpixel luminance corresponding to the third signal and fifth-subpixel luminance corresponding to the fifth signal; and the signal processing circuit renders, when the input signal of the first color in the pixel is greater than a first-color gradation average in an image region including the pixel, the sixth signal equal to the first-color gradation average, renders, when the input signal of the second color in the pixel is greater than a second-color gradation average in an image region including the pixel, the second signal equal to the second-color gradation average, and renders, when the input signal of the third color in the pixel is greater than a third-color gradation average in an image region including the pixel, the fifth signal equal to the third-color gradation average.

9. The display device according to claim 7, wherein:

with regard to a pixel including the first subpixel, the second subpixel, the third subpixel, the fourth subpixel, the fifth subpixel, and the sixth subpixel, first-color luminance corresponding to the input signal of the first color is equal to a sum of first-subpixel luminance corresponding to the first signal and sixth-subpixel luminance corresponding to the sixth signal, second-color luminance corresponding to the input signal of the second color is equal to a sum of second-subpixel luminance corresponding to the second signal and fourth-subpixel luminance corresponding to the fourth signal, and third-color luminance corresponding to the input signal of the third color is equal to a sum of third-subpixel luminance corresponding to the third signal and fifth-subpixel luminance corresponding to the fifth signal; and the signal processing circuit performs, on an image region including the pixel, filtering targeted for each of the input signal of the first color, the input signal of the second color, and the input signal of the third color, wherein the signal processing circuit renders, when the input signal of the first color in the pixel is greater than a first-color filtering value in the pixel, the sixth signal equal to the first-color filtering value and renders a gradation value of the first signal to zero when the input signal of the first color in the pixel is equal to or smaller than the first-color filtering value in the pixel, renders, when the input signal of the second color in the pixel is higher than a second-color filtering value in the pixel, the second signal equal to the second-color filtering value and renders a gradation value of the fourth signal to zero when the input signal of the second color in the pixel is equal to or lower than the second-color filtering value in the pixel, and renders, when the input signal of the third color in the pixel is greater than a third-color filtering value in the pixel, the fifth signal equal to the third-color filtering value and renders a gradation value of the third signal to zero when the input signal of the third color in the pixel is equal to or smaller than the third-color filtering value in the pixel.

10. The display device according to claim 7, wherein:

with regard to a pixel including the first subpixel, the second subpixel, the third subpixel, the fourth subpixel, the fifth subpixel, and the sixth subpixel, first-color luminance corresponding to the input signal of the first color is equal to a sum of first-subpixel luminance corresponding to the first signal and sixth-subpixel luminance corresponding to the sixth signal, second-color luminance corresponding to the input signal of the second color is equal to a sum of second-subpixel luminance corresponding to the second signal and fourth-subpixel luminance corresponding to the fourth signal, and third-color luminance corresponding to the input signal of the third color is equal to a sum of third-subpixel luminance corresponding to the third signal and fifth-subpixel luminance corresponding to the fifth signal; and the signal processing circuit renders the first signal as a higher gradation value than the sixth signal when the input signal of the first color in the pixel is lower than a first-color threshold, renders the fourth signal as a higher gradation value than the second signal when the input signal of the second color in the pixel is lower than a second-color threshold, and renders the third signal as a higher gradation value than the fifth signal when the input signal of the third color in the pixel is lower than a third-color threshold.

11. The display device according to claim 7, wherein:

with regard to a pixel including the first subpixel, the second subpixel, the third subpixel, the fourth subpixel, the fifth subpixel, and the sixth subpixel, first-color luminance corresponding to the input signal of the first color is equal to a sum of first-subpixel luminance corresponding to the first signal and sixth-subpixel luminance corresponding to the sixth signal, second-color luminance corresponding to the input signal of the second color is equal to a sum of second-subpixel luminance corresponding to the second signal and fourth-subpixel luminance corresponding to the fourth signal, and third-color luminance corresponding to the input signal of the third color is equal to a sum of third-subpixel luminance corresponding to the third signal and fifth-subpixel luminance corresponding to the fifth signal; and the signal processing circuit renders the sixth signal as a higher gradation value than the first signal when the input signal of the first color in the pixel is equal to or smaller than a first-color threshold, renders the second signal as a higher gradation value than the fourth signal when the input signal of the second color in the pixel is equal to or smaller than a second-color threshold, and renders the fifth signal as a higher gradation value than the third signal when the input signal of the third color in the pixel is equal to or smaller than a third-color threshold.

12. The display device according to claim 7, wherein first-signal and sixth-signal gradation values with respect to the input signal of the first color, second-signal and fourth-signal gradation values with respect to the input signal of the second color, and third-signal and fifth-signal gradation values with respect to the input signal of the third color are set in accordance with a display-color-gamut mode.

13. A display device comprising:
a first pixel electrode electrically connected to a first transistor;
a second pixel electrode electrically connected to a second transistor and formed in a same layer as the first pixel electrode;
a first light-emitting layer formed over the first pixel electrode and overlapping the first pixel electrode; and
a second light-emitting layer formed over the second pixel electrode and overlapping the second pixel electrode,
wherein the first light-emitting layer includes a quantum-dot light-emitting layer that emits light of a first color, and
the second light-emitting layer includes an organic light-emitting layer that emits light of a second color different from the first color,
the display device further comprising:
a third pixel electrode electrically connected to a third transistor and formed in a same layer as the first pixel electrode;
a fourth pixel electrode electrically connected to a fourth transistor and formed in a same layer as the first pixel electrode;
a third light-emitting layer formed over the third pixel electrode and overlapping the third pixel electrode; and
a fourth light-emitting layer formed over the fourth pixel electrode and overlapping the fourth pixel electrode,
wherein the third light-emitting layer includes a quantum-dot light-emitting layer that emits light of a third color different from the first color and the second color,
the fourth light-emitting layer includes a quantum-dot light-emitting layer that emits light of a fourth color different from the first color, the second color, and the third color, and
the second color is white, and
the display device further comprising:
a first subpixel including the first pixel electrode;
a third subpixel including the third pixel electrode;
a fourth subpixel including the fourth pixel electrode;
a seventh subpixel including the second pixel electrode;
a signal processing circuit configured to generate a first signal corresponding to the first subpixel, a third signal corresponding to the third subpixel, a fourth signal corresponding to the fourth subpixel, and a seventh signal corresponding to the seventh subpixel in response to a first-color input signal, a third-color input signal, and a fourth-color input signal; and
a driver configured to perform a hold control based on the seventh signal, and an impulse control based on the first signal, the third signal, and the fourth signal.

14. The display device according to claim 13, wherein:
the signal processing circuit generates a white input signal from the first-color input signal, the third-color input signal, and the fourth-color input signal;
the signal processing circuit is further configured to generate the seventh signal using the white input signal;
with regard to a pixel including the first subpixel, the third subpixel, the fourth subpixel, and the seventh subpixel,
first-color luminance corresponding to the first-color input signal is equal to a sum of first-subpixel luminance corresponding to the first signal and seventh-subpixel first-color luminance corresponding to the seventh signal,
third-color luminance corresponding to the third-color input signal is equal to a sum of third-subpixel luminance corresponding to the third signal and seventh-subpixel third-color luminance corresponding to the seventh signal, and
fourth-color luminance corresponding to the fourth-color input signal is equal to a sum of fourth-subpixel luminance corresponding to the fourth signal and seventh-subpixel fourth-color luminance corresponding to the seventh signal; and
when the white input signal in the pixel is greater than a white gradation average in an image region including the pixel, the signal processing circuit renders the seventh signal equal to the white gradation average.

15. The display device according to claim 13, wherein:
the signal processing circuit generates a white input signal from the first-color input signal, the third-color input signal, and the fourth-color input signal;
the signal processing circuit is further configured to generate the seventh signal using the white input signal;
with regard to a pixel including the first subpixel, the third subpixel, the fourth subpixel, and the seventh subpixel,
first-color luminance corresponding to the first-color input signal is equal to a sum of first-subpixel luminance corresponding to the first signal and seventh-subpixel first-color luminance corresponding to the seventh signal,
third-color luminance corresponding to the third-color input signal is equal to a sum of third-subpixel luminance corresponding to the third signal and seventh-subpixel third-color luminance corresponding to the seventh signal, and
fourth-color luminance corresponding to the fourth-color input signal is equal to a sum of fourth-subpixel luminance corresponding to the fourth signal and seventh-subpixel fourth-color luminance corresponding to the seventh signal; and
the signal processing circuit performs white input signal-targeted filtering on an image region including the pixel, wherein the signal processing unit
renders, when the white input signal in the pixel is greater than a white filtering value in the pixel, the seventh signal equal to the white filtering value, and
renders the seventh signal equal to the white input signal when the white input signal in the pixel is equal to or smaller than the white filtering value in the pixel.

16. The display device according to claim 13, wherein:
the signal processing circuit generates a white input signal from the first-color input signal, the third-color input signal, and the fourth-color input signal;
the signal processing circuit is further configured to generate the seventh signal using the white input signal;
with regard to a pixel including the first subpixel, the third subpixel, the fourth subpixel, and the seventh subpixel,
first-color luminance corresponding to the first-color input signal is equal to a sum of first-subpixel luminance corresponding to the first signal and seventh-subpixel first-color luminance corresponding to the seventh signal,
third-color luminance corresponding to the third-color input signal is equal to a sum of third-subpixel luminance corresponding to the third signal and seventh-subpixel third-color luminance corresponding to the seventh signal, and
fourth-color luminance corresponding to the fourth-color input signal is equal to a sum of fourth-subpixel luminance corresponding to the fourth signal and seventh-subpixel fourth-color luminance corresponding to the seventh signal; and the signal processing circuit
renders a gradation value of the seventh signal to zero when the white input signal in the pixel is lower than a white threshold.

17. The display device according to claim 13, wherein:

the signal processing circuit generates a white input signal from the first-color input signal, the third-color input signal, and the fourth-color input signal;

the signal processing circuit is further configured to generate the seventh signal using the white input signal;

with regard to a pixel including the first subpixel, the third subpixel, the fourth subpixel, and the seventh subpixel, first-color luminance corresponding to the first-color input signal is equal to a sum of first-subpixel luminance corresponding to the first signal and seventh-subpixel first-color luminance corresponding to the seventh signal, third-color luminance corresponding to the third-color input signal is equal to a sum of third-subpixel luminance corresponding to the third signal and seventh-subpixel third-color luminance corresponding to the seventh signal, and fourth-color luminance corresponding to the fourth-color input signal is equal to a sum of fourth-subpixel luminance corresponding to the fourth signal and seventh-subpixel fourth-color luminance corresponding to the seventh signal; and the signal processing circuit
renders the seventh signal equal to the white input signal when the white input signal in the pixel is equal to or greater than a white threshold.

\* \* \* \* \*